(12) United States Patent
Togashi et al.

(10) Patent No.: US 11,961,865 B2
(45) Date of Patent: Apr. 16, 2024

(54) SEMICONDUCTOR DEVICE, METHOD OF MANUFACTURING A SEMICONDUCTOR DEVICE, SOLID-STATE IMAGING DEVICE, AND ELECTRONIC APPARATUS

(71) Applicant: SONY CORPORATION, Tokyo (JP)

(72) Inventors: Hideaki Togashi, Kanagawa (JP); Kosuke Nakanishi, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 134 days.

(21) Appl. No.: 16/074,669

(22) PCT Filed: Nov. 2, 2016

(86) PCT No.: PCT/JP2016/082572
§ 371 (c)(1),
(2) Date: Aug. 1, 2018

(87) PCT Pub. No.: WO2017/138197
PCT Pub. Date: Aug. 17, 2017

(65) Prior Publication Data
US 2019/0057997 A1 Feb. 21, 2019

(30) Foreign Application Priority Data
Feb. 9, 2016 (JP) .................................. 2016-022717

(51) Int. Cl.
*H01L 27/146* (2006.01)
*H01L 21/8234* (2006.01)
*H01L 23/48* (2006.01)
(Continued)

(52) U.S. Cl.
CPC .................. *H01L 27/14636* (2013.01); *H01L 21/823456* (2013.01); *H01L 21/823487* (2013.01);
(Continued)

(58) Field of Classification Search
CPC ............ H01L 29/66666; H01L 29/7827; H01L 27/14614; H01L 27/307; H01L 25/0657;
(Continued)

(56) References Cited

U.S. PATENT DOCUMENTS 5,554,870 A * 9/1996 Fitch .................... H01L 27/1104
257/329
8,492,903 B2 * 7/2013 Bartley ............. H01L 29/66666
257/774
(Continued)

FOREIGN PATENT DOCUMENTS

CN 104981906 A 10/2015
DE 19807776 A1 * 9/1999 ..... H01L 21/823487
(Continued)

OTHER PUBLICATIONS

International Search Report prepared by the Japan Patent Office dated Dec. 15, 2016, for International Application No. PCT/JP2016/082572.

*Primary Examiner* — Peter M Albrecht
(74) *Attorney, Agent, or Firm* — Sheridan Ross PC

(57) ABSTRACT

A semiconductor device of the present disclosure includes: a semiconductor element disposed on a first surface side of a semiconductor substrate; a through-electrode that is provided through the semiconductor substrate in a thickness direction of the semiconductor substrate and introduces charge obtained in the semiconductor element to a second surface side of the semiconductor substrate; and an amplifier transistor that outputs an electrical signal based on the charge introduced by the through-electrode, the amplifier transistor using the through-electrode as a gate electrode and including a source region and a drain region around the through-electrode.

16 Claims, 26 Drawing Sheets

(51) Int. Cl.
    *H01L 27/088*     (2006.01)
    *H01L 29/08*     (2006.01)
    *H01L 29/423*     (2006.01)
    *H01L 29/78*     (2006.01)
    *H01L 27/06*     (2006.01)

(52) U.S. Cl.
    CPC .......... *H01L 23/481* (2013.01); *H01L 27/088* (2013.01); *H01L 27/14612* (2013.01); *H01L 27/14614* (2013.01); *H01L 27/14638* (2013.01); *H01L 27/14643* (2013.01); *H01L 27/14645* (2013.01); *H01L 27/14667* (2013.01); *H01L 27/14689* (2013.01); *H01L 29/0847* (2013.01); *H01L 29/4236* (2013.01); *H01L 29/42376* (2013.01); *H01L 29/7827* (2013.01); *H01L 21/823418* (2013.01); *H01L 27/0694* (2013.01); *H01L 27/1464* (2013.01); *H01L 29/78* (2013.01)

(58) Field of Classification Search
    CPC ........... H01L 27/14634; H01L 27/0922; H01L 27/301; H10K 39/32
    See application file for complete search history.

(56) References Cited

U.S. PATENT DOCUMENTS

| | | | |
|---|---|---|---|
| 2007/0215204 A1* | 9/2007 | Maehara | H01L 31/0216 |
| | | | 136/256 |
| 2008/0265352 A1 | 10/2008 | Akiyoshi | |
| 2009/0090903 A1* | 4/2009 | Kim | H01L 51/0036 |
| | | | 257/E51.013 |
| 2011/0042723 A1 | 2/2011 | Mabuchi | |
| 2012/0211829 A1* | 8/2012 | Bartley | H01L 25/0657 |
| | | | 257/332 |
| 2013/0264467 A1 | 10/2013 | Hong et al. | |
| 2015/0200152 A1* | 7/2015 | Kang | H01L 21/76898 |
| | | | 257/401 |

FOREIGN PATENT DOCUMENTS

| | | |
|---|---|---|
| JP | 2008-258316 | 10/2008 |
| JP | 2015-038931 | 2/2015 |
| JP | 2016-009777 | 1/2016 |
| WO | WO-2015137147 A1 | 9/2015 |

\* cited by examiner

SEMICONDUCTOR DEVICE, METHOD OF MANUFACTURING A SEMICONDUCTOR DEVICE, SOLID-STATE IMAGING DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2016/082572 having an international filing date of 02 Nov. 2016, which designated the United States, which PCT application claimed the benefit of Japanese Patent Application No. 2016-022717 filed 09 Feb. 2016, the entire disclosures of each of which are incorporated herein by reference.

TECHNICAL FIELD

The present disclosure relates to a semiconductor device, a method of manufacturing a semiconductor device, a solid-state imaging device, and an electronic apparatus.

BACKGROUND ART

As a trend of a semiconductor device such as a solid-state imaging device, function adding and improvement in device characteristics by lamination in a three- dimensional direction have recently attracted attention in addition to miniaturization/integration in a plane direction. For the lamination in the three- dimensional direction, the through chip via (TCV) technology to perform electrical connection by a through-electrode penetrating a semiconductor substrate is used for electrical connection between a front surface and a back surface of the semiconductor substrate (semiconductor chip), between a plurality of semiconductor substrates, and between a semiconductor substrate and a film formed of a different material.

In the semiconductor device using the TCV technology, coupling between the through-electrode and an element within the semiconductor substrate or a dark current generated from a damaged layer of a side surface of the through-electrode deteriorates device characteristics, and thus a sufficient separation structure is necessary between the through-electrode and the semiconductor substrate. As the separation structure, for example, a dark current suppressing structure using a pinning film, which is for reducing a capacitance by using a vacancy or a low dielectric constant material, is known (see, e.g., Patent Literature 1).

CITATION LIST

Patent Literature

Patent Literature 1: Japanese Patent Application Laid-open No. 2015-38931

DISCLOSURE OF INVENTION

Technical Problem

However, in the conventional technology described in Patent Literature 1, a through-electrode equipped with the sufficient separation structure and the dark current suppressing mechanism needs a large area, which occupies an area of another element within the semiconductor substrate. In particular, in a semiconductor device including a through-electrode and a transistor in combination, transistor characteristics are deteriorated because amplification characteristics and noise characteristics are dependent on the size of the transistor. Further, an earth capacitance between the through-electrode and the semiconductor substrate and a wiring capacitance between the through-electrode and the transistor are increased.

It is an object of the present disclosure to provide a semiconductor device capable of minimizing an area occupied by a through-electrode for another element within a semiconductor substrate, a method of manufacturing a semiconductor device, a solid-state imaging device, and an electronic apparatus including the solid-state imaging device.

Solution to Problem

In order to achieve the object described above, there is provided a semiconductor device of the present disclosure, including: a semiconductor element disposed on a first surface side of a semiconductor substrate; a through-electrode that is provided through the semiconductor substrate in a thickness direction of the semiconductor substrate and introduces charge obtained in the semiconductor element to a second surface side of the semiconductor substrate; and an amplifier transistor that outputs an electrical signal based on the charge introduced by the through-electrode, the amplifier transistor using the through-electrode as a gate electrode and including a source region and a drain region around the through-electrode.

Further, in order to achieve the object described above, there is provided a method of manufacturing a semiconductor device of the present disclosure, the semiconductor device including a semiconductor element disposed on a first surface side of a semiconductor substrate, a through-electrode that is provided through the semiconductor substrate in a thickness direction of the semiconductor substrate and introduces charge obtained in the semiconductor element to a second surface side of the semiconductor substrate, and an amplifier transistor that outputs an electrical signal based on the charge introduced by the through-electrode, the method including: using the through-electrode as a gate electrode of the amplifying transistor; and forming a source region and a drain region of the amplifier transistor around the through-electrode.

Further, in order to achieve the object described above, there is provided a solid-state imaging device of the present disclosure, including: a photoelectric converter element disposed on a first surface side of a semiconductor substrate; a through-electrode that is provided through the semiconductor substrate in a thickness direction of the semiconductor substrate and introduces charge obtained by photoelectric conversion of the photoelectric converter element to a second surface side of the semiconductor substrate; and an amplifier transistor that outputs an electrical signal based on the charge introduced by the through-electrode, the amplifier transistor using the through-electrode as a gate electrode and including a source region and a drain region around the through-electrode. Further, in order to achieve the object described above, there is provided an electronic apparatus of the present disclosure, including a solid-state imaging device having the configuration described above.

Advantageous Effects of Invention

According to the present disclosure, since the through-electrode also serves as a gate electrode of the amplifier transistor, it is possible to minimize the area occupied by the through-electrode for another element within the semiconductor substrate. It should be noted that the present disclosure is not necessarily limited to have the effects described herein, and any one of the effects described herein may be produced. Further, the effects described herein are merely examples and are not restrictive, and additional effects may be produced.

MODE(S) FOR CARRYING OUT THE INVENTION

Figure 1A:
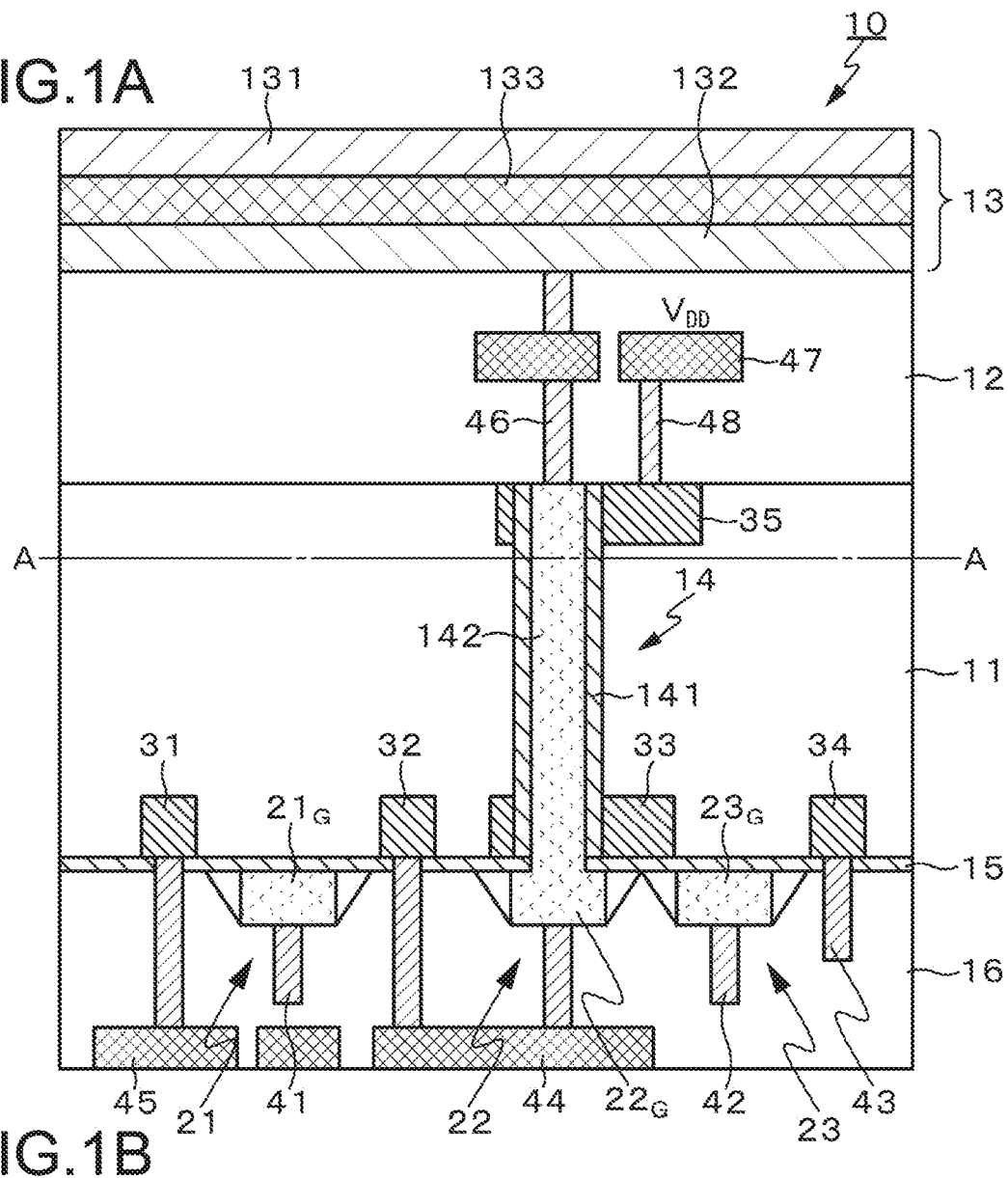
FIG. 1A is a cross-sectional view showing a solid-state imaging device of Embodiment 1.

Hereinafter, embodiments of the present disclosure will be described in detail with reference to the drawings. The technology of the present disclosure is not limited to the embodiments, and various numerical values, materials, and the like in the embodiments are examples. In the following description, identical elements or elements having an identical function are denoted by identical symbols, and overlapping description will be omitted. It should be noted that the description will be given in the following order.

1. Overall description on semiconductor device, method of manufacturing the same, solid-state imaging device, and electronic apparatus of present disclosure
2. Embodiment 1 (Solid-state imaging device according to one mode of present disclosure)
3. Embodiment 2 (Modified example oi Embodiment 1)
4. Embodiment 3 (Modified example of Embodiment 1)
5. Embodiment 4 (Modified example of Embodiment 1)
6. Embodiment 5 (Modified example of Embodiment 1 to Embodiment 4)
7. Embodiment (Method of manufacturing solid-state imaging device of Embodiment 1)
8. Reference example (Basic configuration where through-electrode and transistor are provided in combination)
9. Embodiment 7 (Channel structure of amplifier transistor)
10. Embodiment 8 (Electronic-conversion-type backside illumination solid-state imaging device using vertical dichroic spectroscopy)
11. Embodiment 9 (Modified example of Embodiment 8)
12. Embodiment 10 (Modified example of Embodiment 9)
13. Embodiment 11 (Modified example of Embodiment 8)
14. Embodiment 12 (Solid-state imaging device having high-performance transistor operation and separation characteristics)
15. Embodiment 13 (Modified example of Embodiment 12)
16. Embodiment 14 (Modified example of Embodiment 7 to Embodiment 12)
17. Embodiment 15 (Modified example of Embodiment 7 to Embodiment 12)

18. Embodiment 16 (Modified example of Embodiment 1 to Embodiment 12)
19. Embodiment 17 (Solid-state imaging device functioning as wavelength converter element)
20. Embodiment 18 (Modified example of Embodiment 17)
21. Embodiment 19 (Method of manufacturing solid-state imaging device of Embodiment 7)
22. Electronic apparatus of present disclosure (example of imaging apparatus)

<Overall Description on Semiconductor Device, Method of Manufacturing the Same, Solid-State Imaging Device, and Electronic Apparatus of Present Disclosure>

In a semiconductor device, a method of manufacturing the same, a solid-state imaging device, and an electronic apparatus of the present disclosure, a semiconductor substrate can have a configuration using a silicon substrate. Additionally, various semiconductor materials such as a chemical compound material and an organic semiconductor material including, but not limited to, a silicon material can be used as constituent materials of the semiconductor substrate. Further, either a configuration in which a photoelectric converter element is formed in the semiconductor substrate or a configuration in which a photoelectric converter element is not formed in the semiconductor substrate can be provided.

In the semiconductor device, the method of manufacturing the same, the solid-state imaging device and the electronic apparatus of the present disclosure including the favorable configuration described above, a semiconductor element can have a configuration including a photoelectric conversion film sandwiched between two transparent electrodes laminated on a first surface side of the semiconductor substrate. Alternatively, the semiconductor element can have a configuration including a semiconductor element formed on another semiconductor substrate, which is disposed on the first surface side of the semiconductor substrate.

In the semiconductor device, the method of manufacturing the same, the solid-state imaging device, and the electronic apparatus of the present disclosure including the favorable configuration described above, a through-electrode can be configured to include an electric conductor provided through the semiconductor substrate and a separation layer that electrically separates the electric conductor and the semiconductor substrate from each other. A constituent material of the electric conductor may be not only one type of metal material but also a combination of several types of metal materials. For example, the electric conductor includes one or more of a doped silicon material such as PDAS (Phosphorus Doped Amorphous Silicon) and a metal material (electrically conductive material) such as aluminum, tungsten, titanium, cobalt, hafnium, or tantalum.

Additionally, in the semiconductor device, the method of manufacturing the same, the solid-state imaging device, and the electronic apparatus of the present disclosure including the favorable configuration described above, the separation layer can be configured to include an insulating film that covers a side wall of the electric conductor. Further, the film thickness of the insulating film can be configured to differ depending on a position of the semiconductor substrate in a depth direction. Further, the insulating film material can include many layers.

Additionally, in the semiconductor device, the method of manufacturing the same, the solid-state imaging device, and the electronic apparatus of the present disclosure including the favorable configuration described above, a source region and a drain region of an amplifier transistor can be configured to be each formed of a diffusion layer that is present in the vicinity of the insulating film and is formed at a part of or over the entire region of the semiconductor substrate in the depth direction.

Further, in the semiconductor device, the method of manufacturing the same, the solid-state imaging device, and the electronic apparatus of the present disclosure including the favorable configuration described above, a planar transistor formed on a flat surface of the semiconductor substrate is provided. The planar transistor can have a configuration in which a gate oxide film of the planar transistor and a gate oxide film of the amplifier transistor are different from each other in a film thickness. Alternatively, the planar transistor can have a configuration in which the gate oxide film of the planar transistor and the gate oxide film of the amplifier transistor are different from each other a constituent material.

Further, in the semiconductor device, the method of manufacturing the same, the solid-state imaging device, and the electronic apparatus of the present disclosure including the favorable configuration described above, a cap electrode including an electric conductor and provided at the top of the through-electrode provided. The cap electrode can be configured to be extended to the vicinity of the source region, the drain region, or a channel region of the amplifier transistor.

Further, in the semiconductor device, the method of manufacturing the same, the solid-state imaging device, and the electronic apparatus of the present disclosure including the favorable configuration described above, the electric conductor can be configured to include at least one layer in a length direction and to be formed of at least one type of electric conductor material. For example, the electric conductor can be configured to include a first electric conductor functioning as a gate electrode of the amplifier transistor and a second electric conductor continuous with the first electric conductor.

Additionally, in the semiconductor device, the method of manufacturing the same, the solid state imaging device, and the electronic apparatus of the present disclosure including the favorable configuration described above, the first electric conductor can be configured to have a work function that desirably sets the operation range of the amplifier transistor. Further, an insulating film that separates the first electric conductor and the semiconductor substrate from each other can be configured to be thinner than an insulating film that separates the second electric conductor and the semiconductor substrate from each other, and to be formed of a material having a higher dielectric constant than a material of the insulating film that separates the second electric conductor and the semiconductor substrate from each other. Further, the second electric conductor can be configured to have a smaller diameter than that of the first electric conductor and to be formed of an electrically conductive material.

Additionally, in the semiconductor device, the method of manufacturing the same, the solid-state imaging device, and the electronic apparatus of the present disclosure including the favorable configuration described above, the insulating film around the first electric conductor and the insulating film around the second electric conductor can be configured to be different from each other a film thickness. Further, the insulating film around the second electric conductor can be configured to be formed of a low dielectric constant insulating film.

Additionally, in the semiconductor device, the method of manufacturing the same, the solid-state imaging device, and the electronic apparatus of the present disclosure including the favorable configuration described above, the insulating film around the second electric conductor favorably has a configuration including, together with a vacancy that intervenes between the insulating film and the second electric conductor, a separation structure that electrically separates the second electric conductor and the semiconductor substrate from each other. Further, a fixed charge amount applied to the insulating film around the first electric conductor and a fixed charge amount applied to the insulating film around the second electric conductor can be configured to be different from each other.

Further, in the semiconductor device, the method of manufacturing the same, the solid-state imaging device, and the electronic apparatus of the present disclosure including the favorable configuration described above, the gate electrode the amplifier transistor can be configured to have a cross-sectional shape that a polygon including a circle or a rectangle.

As the semiconductor device of the present disclosure, a solid-state imaging device in which pixels (unit pixels) each including the photoelectric converter element as an example of the semiconductor element are arrayed in a two-dimensional matrix in a first direction (row direction) and a second direction (column direction) can be exemplified. However, the semiconductor device of the present disclosure is not limited to the solid-state imaging device. Specifically, the technology of the present disclosure is applicable to all semiconductor devices each including in combination a through-electrode provided through a semiconductor substrate in a thickness direction thereof and an amplifier transistor that outputs an electrical signal based on charge introduced by the through-electrode. As an example, a semiconductor device using a piezoelectric sensor element can be exemplified as the semiconductor element disposed on the first surface side of the semiconductor substrate.

In this specification, a solid-state imaging device will be described as an example of the semiconductor device of the present disclosure. In the solid-state imaging device, compared with a pixel array in which pixels including the photoelectric converter elements are arrayed in a two-dimensional matrix, a filter structure including color filters of R (red), G (green), and B (blue) arranged in a planar manner is widely employed. However, this filter structure may cause a false color.

In order to solve this problem of the false color, a structure in which photoelectric conversion regions where red, green, and blue light having respective wavelengths are photoelectrically converted are laminated in the vertical direction of an identical pixel (optical axis direction) has been employed from the past (see, e.g., Japanese Patent Application Laid-open No. 2006-120921). Further, a structure in which a photoelectric conversion region is provided outside a semiconductor substrate, for example, a structure in which a photoelectric converter element is disposed on the upper portion of the semiconductor substrate and a photoelectric conversion signal is accumulated in the semiconductor substrate, is employed (see, e.g., Japanese Patent Application Laid-open Nos. 2010-278086 and 2011-138927).

In a case where the structures as described above are applied to a backside illumination solid-state imaging device, it is necessary to form a contact portion, which connects charge obtained from a photoelectric conversion film to the semiconductor substrate, on the back surface on the front surface side of the semiconductor. The front surface of the semiconductor substrate on the back surface side, to which a high temperature process cannot be applied, generally has a high interface state. Additionally, a high-concentration impurity region is diffused and a depletion layer region becomes large, and thus a dark current is relatively increased. Therefore, in the past, the backside illumination solid-state imaging device has been provided with a through-electrode for each pixel on the semiconductor substrate, and the charge from the photoelectric converter element has been transferred to the front surface side of the semiconductor substrate via the through-electrode (see, e.g., Japanese Patent Application Laid-open No. 2011-29337).

By the way, in general, in the through-electrode, the center portion thereof is formed of an electrically conductive material, and an insulating film is formed between the center portion formed of an electrically conductive material and a semiconductor substrate. The through-electrode penetrates the semiconductor substrate and is connected to a modulation transistor and a floating diffusion (floating diffusion layer). For this reason, a capacitance is generated between the through-electrode and the semiconductor substrate. If this capacitance is large, conversion efficiency for converting the charge from the photoelectric converter element into an electrical signal decreases. In order to reduce the capacitance, increasing a distance between the through-electrode and the semiconductor substrate is taken as a relatively easy measure. In this case, however, a proportion of the through-electrode in the pixel flat surface increases, and thus an element area enlarges.

Hereinafter, a solid-state imaging device as an example of a semiconductor device of the present disclosure and a method of driving the solid-state imaging device will be described on the basis of the embodiments. Each of the embodiments has the following configuration.

Embodiment 1: Solid-state imaging device according to one mode of present disclosure
Configurations of source region and drain region of amplifier transistor
Embodiment 2: Modified example of Embodiment 1/Configurations of source region and drain region of amplifier transistor
Embodiment 3: Modified example of Embodiment 1/Shape of through-electrode
Embodiment 4: Modified example of Embodiment 1/Arrangement of another semiconductor substrate
Embodiment 5: Modified example of Embodiment 1 to Embodiment 4/Reduction in capacitance of through-electrode
Embodiment 6: Method of manufacturing solid-state imaging device of Embodiment 1
Reference example: Basic configuration where through-electrode and transistor are provided in combination
Embodiment 7: Channel structure of amplifier transistor
Embodiment 8: Electronic-conversion-type backside illumination solid-state imaging device using vertical dichroic spectroscopy
Embodiment 9: Modified example of Embodiment 8/Back surface side structure of wiring of through-electrode
Embodiment 10: Modified example of Embodiment 9/Back surface side structure of wiring of through-electrode
Embodiment 11: Modified example of Embodiment 8/Structure without wiring of through-electrode
Embodiment 12: Solid-state imaging device having high-performance transistor operation and separation characteristics
Embodiment 13: Modified example of Embodiment 12/Shape of through-electrode
Embodiment 14: Modified example of Embodiment 7 to Embodiment 12/Arrangement of source region and drain region Embodiment 15: Modified example of Embodiment 7 to Embodiment 12/Arrangement of source region and drain region
Embodiment 16: Modified example of Embodiment 1 to Embodiment 12/Combination of side surface channel and front surface channel transistor
Embodiment 17: Solid-state imaging device functioning as wavelength converter element
Embodiment 18: Modified example of Embodiment 17/Example of forming reset transistor across through-electrode
Embodiment 19: Method of manufacturing solid-state imaging device of Embodiment 7

Embodiment 1

Figure 1B:
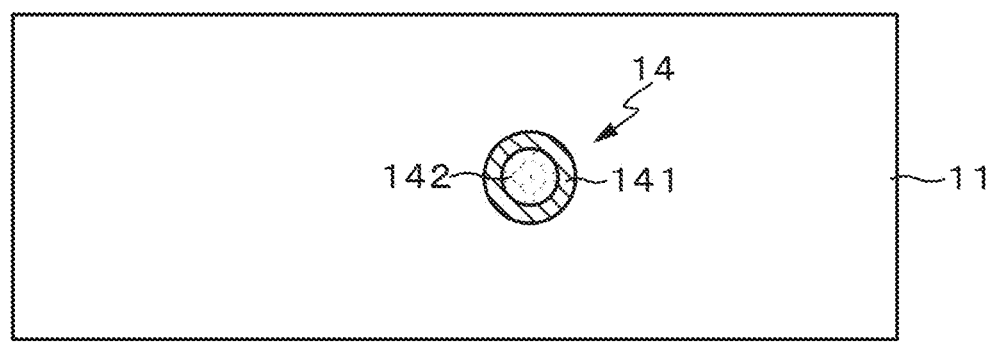
FIG. 1B is a cross-sectional view taken along the line A-A of FIG. 1A.
Figure 2:
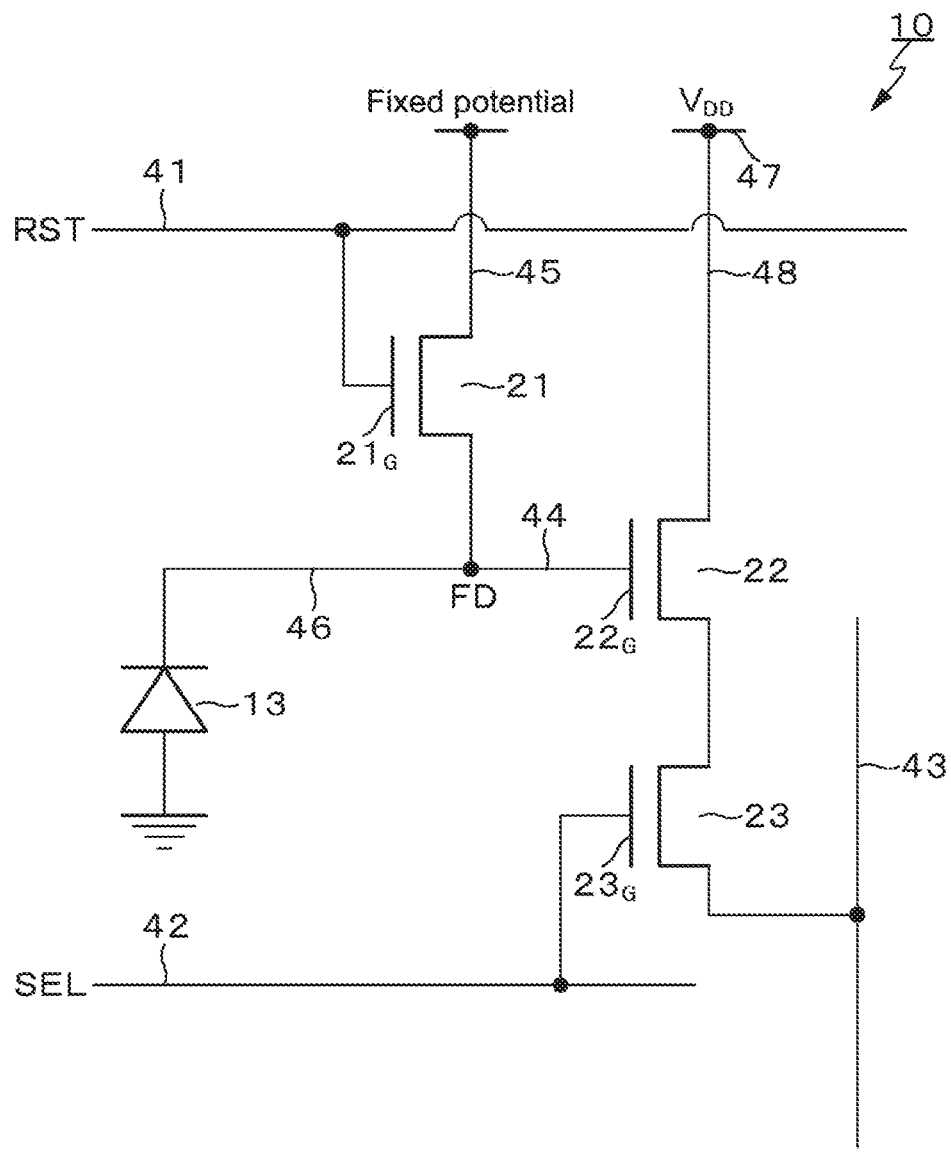
FIG. 2 is a circuit diagram showing an equivalent circuit of a pixel in the solid-state imaging device of Embodiment 1.

Embodiment 1 relates to a solid-state imaging device according to one mode of the present disclosure. FIG. 1A shows a cross-sectional view of the solid-state imaging device of Embodiment 1, and FIG. 1B shows a cross-sectional view taken along the line A-A of FIG. 1A. Further, FIG. 2 shows an equivalent circuit diagram of pixel in the solid-state imaging device of Embodiment 1. FIG. 1A shows a cross-sectional structure of one pixel (unit pixel) 10.

In FIG. 1A, a photoelectric converter element 13 is laminated on a first surface side of a semiconductor substrate (semiconductor chip) 11 via an interlayer insulating film 12. The photoelectric converter element 13 includes, for example, two transparent electrodes 131, 132 and a photoelectric conversion film 133 sandwiched between those transparent electrodes 131, 132. In order to introduce (transfer) the charge obtained by photoelectric conversion in the photoelectric converter element 13 to a second surface side of the semiconductor substrate 11, the semiconductor substrate 11 includes a through-electrode 14 that is provided through the semiconductor substrate 11 in a thickness direction thereof.

A wiring layer 16 is provided on the second surface side of the semiconductor substrate 11 via a gate oxide film (insulating film) 15. In the wiring layer 16, elements forming a pixel, for example, a gate electrode $21_G$ of a reset transistor 21, gate electrode $22_G$ of an amplifier transistor 22, and a gate electrode $23_G$ of a selection transistor 23 are formed. On a surface portion of the semiconductor substrate 11 on the second surface side, diffusion layers 31 to 34 are formed to correspond to the reset transistor 21, the amplifier transistor 22, and the selection transistor 23.

The diffusion layer 31 becomes a drain region of the reset transistor 21. The diffusion layer 32 becomes a source region of the reset transistor 21 and also becomes a floating diffusion (floating diffusion layer) FD. The floating diffusion FD a charge-voltage converter unit (charge detector unit) that converts charge to voltage. The diffusion layer 33 becomes a source region of the amplifier transistor 22 and also becomes a drain region of the selection transistor 23. The diffusion layer 34 becomes a source region of the selection transistor 23.

Additionally, various wires are formed in the wiring layer 16. Specifically, a reset control line 41 that transmits a reset control signal RST to the gate electrode $21_G$ of the reset transistor 21, and a selection control line 42 that transmits a selection control signal SEL to the gate electrode $23_G$ of the selection transistor 23 are formed in the wiring layer 16. Additionally, a vertical signal line 43 that transmits a pixel signal output from the amplifier transistor 22, a wire 44 that electrically connects the gate electrode $22_G$ of the amplifier transistor 22 and the floating diffusion FD to each other, a wire 45 that applies a fixed potential to the drain region of the reset transistor 21, and the like are formed in the wiring layer 16.

In other words, as shown in the circuit diagram of FIG. 2, the reset control signal RST is applied to the gate electrode $21_G$ of the reset transistor 21 via the reset control line 41. The selection control signal SEL is applied to the gate electrode $23_G$ of the selection transistor 23 via the selection control line 42. The reset control signal RST and the selection control signal SEL are output from a vertical scanner unit (row scanner unit) (not shown), for example, in units of pixel row of the pixel array including the pixels 10 disposed in a matrix (in a two-dimensional matrix).

The gate electrode $22_G$ of the amplifier transistor 22 is electrically connected to the photoelectric converter element 13 via a wire 46 and also electrically connected to the floating diffusion FD via the wire 44. The drain region of the amplifier transistor 22 is electrically connected to a power supply line 47 of a power supply potential $V_{DD}$ via a wire 48. The source region of the selection transistor 23 is connected to the vertical signal line 43.

In the circuit example of FIG. 2, for example, N-type MOSFETs are used as the three transistors of the reset transistor 21, the amplifier transistor 22, and the selection transistor 23. However, the combination of the conductivity types of the three transistors 21 to 23 exemplified here is merely an example, and the present disclosure is not limited thereto. In other words, a combination using P-type MOSFETs can also be used appropriately. Further, the selection transistor 23 can take a circuit configuration connected between the power supply potential $V_{DD}$ and the drain region of the amplifier transistor 22.

In the pixel 10 having the circuit configuration described above, the reset transistor 21 enters a conductive state when the reset control signal RST is applied to the gate electrode $21_G$ thereof, and the reset transistor 21 resets the floating diffusion FD by discarding the held charge of the floating diffusion FD to the wire 45 having a fixed potential. The amplifier transistor 22 outputs an electrical signal with the level corresponding to the potential of the floating diffusion FD. The selection transistor 23 enters a conductive state when the selection control signal SEL applied to the gate electrode $23_G$ thereof, and with the pixel 10 being set to a selection state, the selection transistor 23 outputs an electrical signal, which is provided from the amplifier transistor 22, to the vertical signal line 43.

Here, when the second surface of the semiconductor substrate 11, the substrate surface on which the wiring layer 16 including the elements forming the pixel and various wires is formed is assumed as the front surface, the solid-state imaging device of Embodiment 1 is a backside illumination solid-state imaging device in which the photoelectric converter element 13 is laminated on the back surface (first surface) side.

In the backside illumination solid-state imaging device having the configuration described above, the through-electrode 14 for introducing the charge obtained by the photoelectric conversion in the photoelectric converter element 13 to the second surface side of the semiconductor substrate 11 also serves as the gate electrode $22_G$ of the amplifier transistor 22. Specifically the through-electrode 14 has a structure in which the side wall thereof is covered with an insulating film 141, and an electric conductor 142 is embedded in the center portion thereof. The electric conductor at the center portion functions as a vertical gate electrode of the amplifier transistor 22. At the same time, the electric conductor 142 also functions as a through-electrode for supplying a photoelectric conversion current which is provided from the photoelectric converter element 13, from the back surface side of the semiconductor substrate 11 to the front surface side thereof. The insulating film 141 is configured as a separation layer that electrically separates the electric conductor 142 and the semiconductor substrate 11 from each other.

FIG. 1B shows a cross sectional view of the through-electrode 14. FIG. 1B is a cross-sectional view taken along the line A-A of FIG. 1A. As shown in FIG. 1B, in this embodiment, the cross-sectional shape of the through-electrode 14 is circular. Here, the "circular" includes a case of being exactly circular and also a case of being substantially circular, and variations caused in design or manufacturing are permissible.

In the amplifier transistor 22, the diffusion layer 33 to be a source region is formed on the front surface side of the semiconductor substrate 11, whereas a diffusion layer 35 to be a drain region is formed on the back surface side of the semiconductor substrate 11. In such a manner, the source region and the drain region are formed on the front surface side and the back surface side of the semiconductor substrate 11, so that the through-electrode 14 can function as the amplifier transistor 22. In the case of this example, the amplifier transistor 22 is a vertical transistor. The power supply potential $V_{DD}$ is applied to the drain region (diffusion layer 35) of the amplifier transistor 22 from the power supply line 47 via the wire 48.

In the pixel structure of the above-mentioned pixel 10, the photoelectric conversion film 133 of the photoelectric converter element 13 may be formed of, for example, an organic photoelectric conversion material including a rhodamine-based dye, a merocyanine-based dye, or quinacridone. Further, the gate oxide film 15 of the planar transistors (reset transistor 21 and selection transistor 23) formed on the flat surface of the semiconductor substrate 11, and the gate oxide film of the amplifier transistor 22 as a vertical transistor, i.e., the insulating film 141 on the side wall of the through-electrode 14, may be different from each other in a film thickness.

The same holds true for the constituent material of the gate oxide film. In other words, the gate oxide film 15 of the planar transistors and the gate oxide film of the amplifier transistor 22 may be different from each other in the constituent material. The gate oxide film 15 of the planar transistors may be formed of, for example, a constituent material such as a silicon oxide film, TEOS (Tetra Ethyl Ortho Silicate), a silicon nitride film, or a silicon oxynitride film and may include a void therein.

The constituent material of the gate oxide film (insulating film 141) of the amplifier transistor 22 is as follows. In other words, the constituent material includes one or more of a silicon oxide, a silicon oxynitride, a hafnium oxide, an aluminum oxide, a zirconium oxide, a tantalum oxide, a titanium oxide, a lanthanum oxide, a praseodymium oxide, a cerium oxide, a neodymium oxide, a promethium oxide, a samarium oxide, an europium oxide, a gadolinium oxide, a terbium oxide, a dysprosium oxide, a holmium oxide, a thulium oxide, a ytterbium oxide, a lutetium oxide, a yttrium oxide, an aluminum nitride film, a hafnium oxynitride film, an aluminum oxynitride film, and the like.

In the through-electrode 14, the constituent material of the electric conductor 142 at the center portion includes, for example, one or more of a doped silicon material such as PDA; (Phosphorus Doped Amorphous Silicon) and a metal material (electrically conductive material) such as aluminum, tungsten, titanium, cobalt, hafnium, or tantalum. In other words, the constituent material of the electric conductor 142 may be not only one type of metal material but also a combination of several types of metal materials.

As the semiconductor substrate 11, a silicon substrate can be used. However, the semiconductor substrate 11 is also feasible with various semiconductor materials such as a chemical compound material and an organic semiconductor material including, but not limited to, a silicon material. Further, within the semiconductor substrate 11, a photodiode as the photoelectric converter element may be formed or not be formed. In a case where the photodiode is not formed, the thickness of the semiconductor substrate 11 can be made thin, and thus the capacitance of the through-electrode 14 can be reduced. By reduction of this capacitance, conversion efficiency for converting the charge from the photoelectric converter element 13 into an electrical signal can be improved.

Embodiment 2

Figure 3:
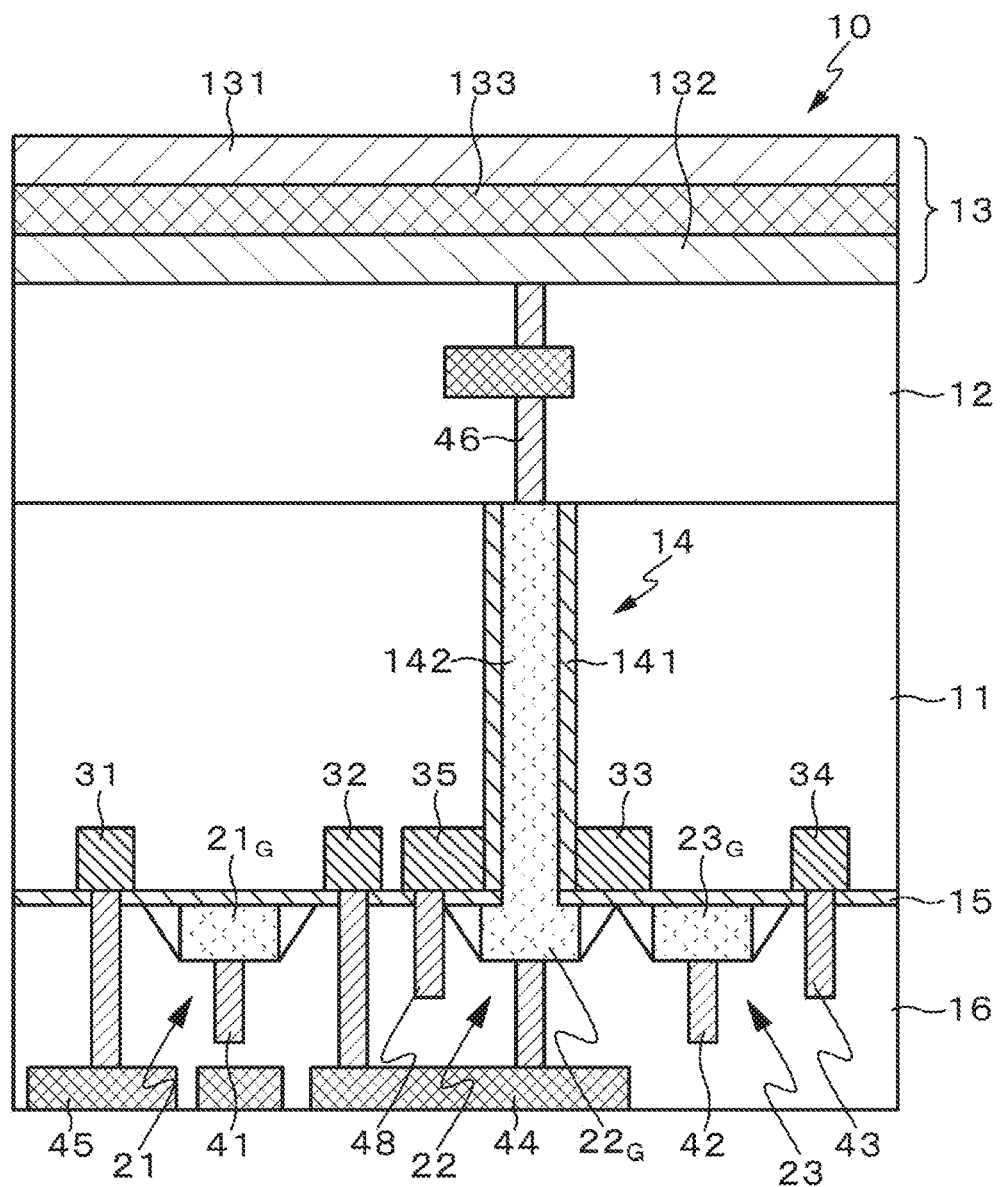
FIG. 3 is a cross-sectional view showing a solid-state imaging device of Embodiment 2.

Embodiment 2 is a modified example of Embodiment 1. FIG. 3 shows a cross-sectional view of a solid-state imaging device of Embodiment 2. In Embodiment 1, regarding the amplifier transistor 22 formed using the through-electrode 14, the source region is disposed on the front surface side of the semiconductor substrate 11, and the drain region is disposed on the back surface side of the semiconductor substrate 11. However, the source region and the drain region of the amplifier transistor 22 are not limited to those of Embodiment 1 and can be formed of the diffusion layer 33 and the diffusion layer 35, which are present in the vicinity of the insulating film 141 and formed at a part of or over the entire region of the semiconductor substrate 11 in the depth direction.

Embodiment 2 has a configuration in which the source region and the drain region of the amplifier transistor 22 are both provided on the front surface side of the semiconductor substrate 11. In such a manner, when the drain region of the amplifier transistor 22 is provided on the front surface side of the semiconductor substrate 11, in that drain region, the power supply line of the power supply potential $V_{DD}$ can be used in common to a power supply line of another power supply potential $V_{DD}$. Thus, as compared with the case where the drain region of the amplifier transistor 22 is provided on the back surface side of the semiconductor substrate 11, reduction in area can be achieved.

Embodiment 3

Figure 4A:
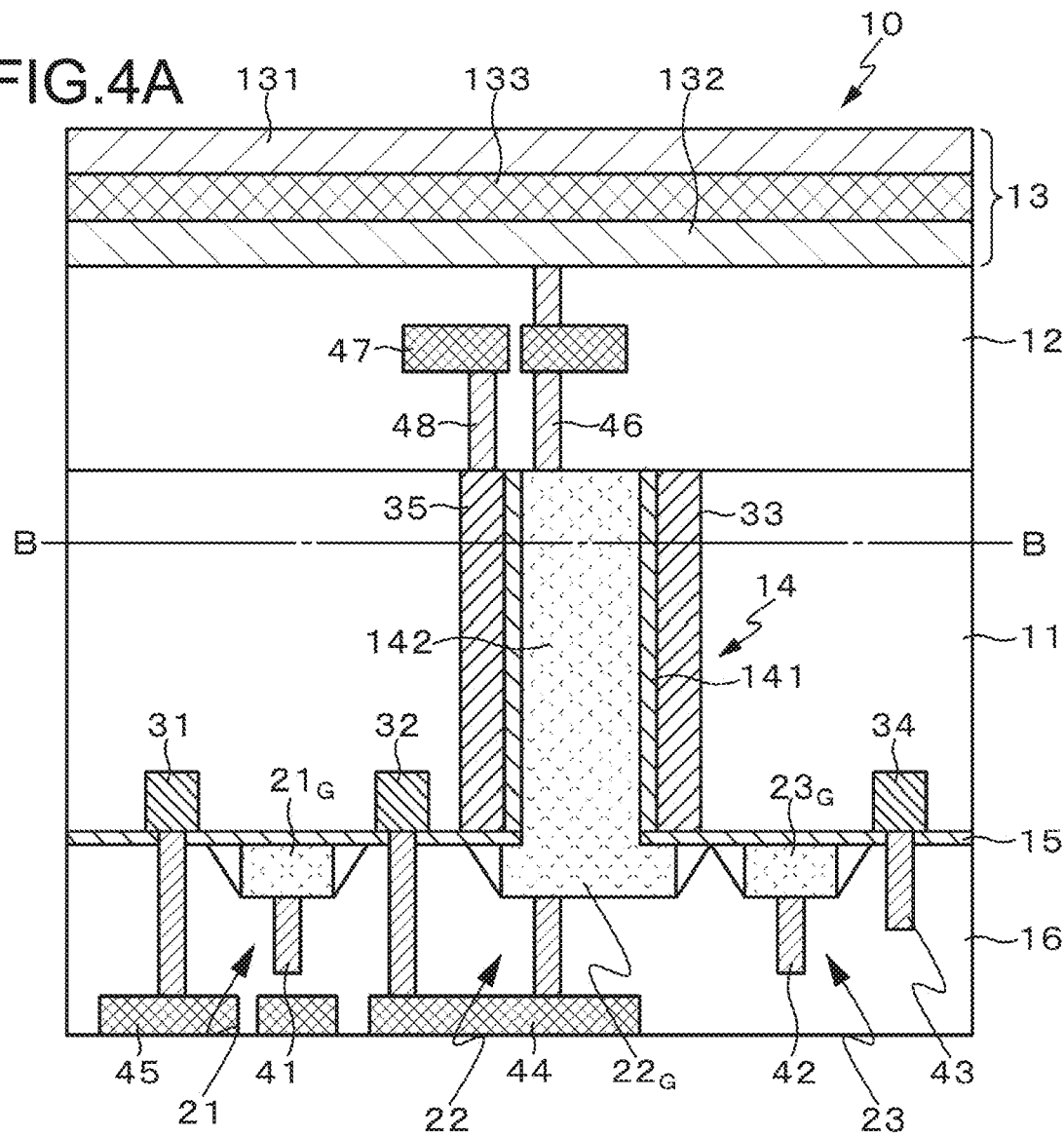
FIG. 4A is a cross-sectional view showing a solid-state imaging device of Embodiment 3.
Figure 4B:
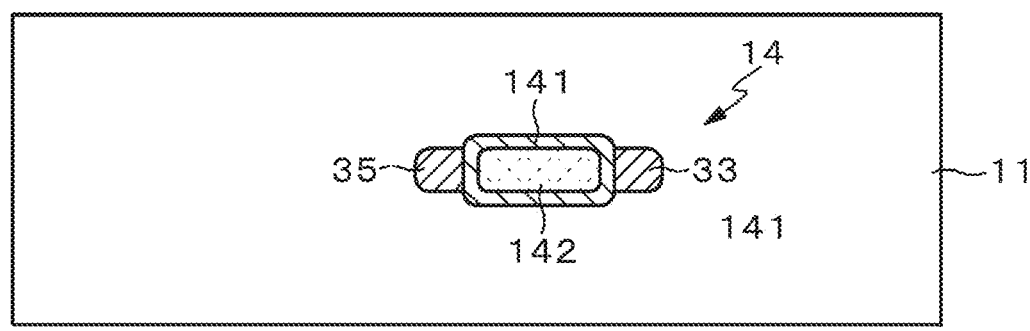
FIG. 4B is a cross-sectional view taken along the line B-B of FIG. 4A.

Embodiment 3 is a modified example of Embodiment 1. FIG. 4A shows a cross-sectional view of a solid-state imaging device of Embodiment 3, and FIG. 4B shows a cross-sectional view taken alone the line B-B of FIG. 4A. In Embodiment 1, the cross-sectional shape of the through-electrode 14 is circular. In contrast to this, in Embodiment 3, the cross-sectional shape of the through-electrode 14 is rectangular (actually, rounded rectangle whose corners are rounded).

Further, in the amplifier transistor 22, the diffusion layer 33 to be a source region and the diffusion layer 35 to be a drain region are formed on both sides of the short-sides of the through-electrode 14, from the front surface side of the semiconductor substrate 11 to the back surface side thereof. It should be noted that here the diffusion layers 33, 35 are formed from the front surface side to the back surface side of the semiconductor substrate 11, but as in the case of Embodiment 1, one of the diffusion layers may be provided on the front surface side, and the other may be provided on the back surface side.

In such a manner, when the structure in which the cross-sectional shape of the through-electrode 14 is set to be rectangular, and the diffusion layer 33 to be a source region and the diffusion layer 35 to be a drain region are formed on both sides of the short-sides of the through-electrode 14 is provided, the crystal surface orientation of the side wall of the through-electrode 14 can be made uniform. This can suppress dark current/white spot characteristics or improve the degree of freedom regarding the design of a channel length/width.

It should be noted that the cross-sectional shape of the through-electrode 14 is not limited to be rectangular, and various shapes other than a true circle, an ellipse, and a rectangle can be employed. Further, in the depth direction (longitudinal direction) of the through-electrode 14, the shape may differ depending on a depth position thereof.

Embodiment 4

Figure 5:
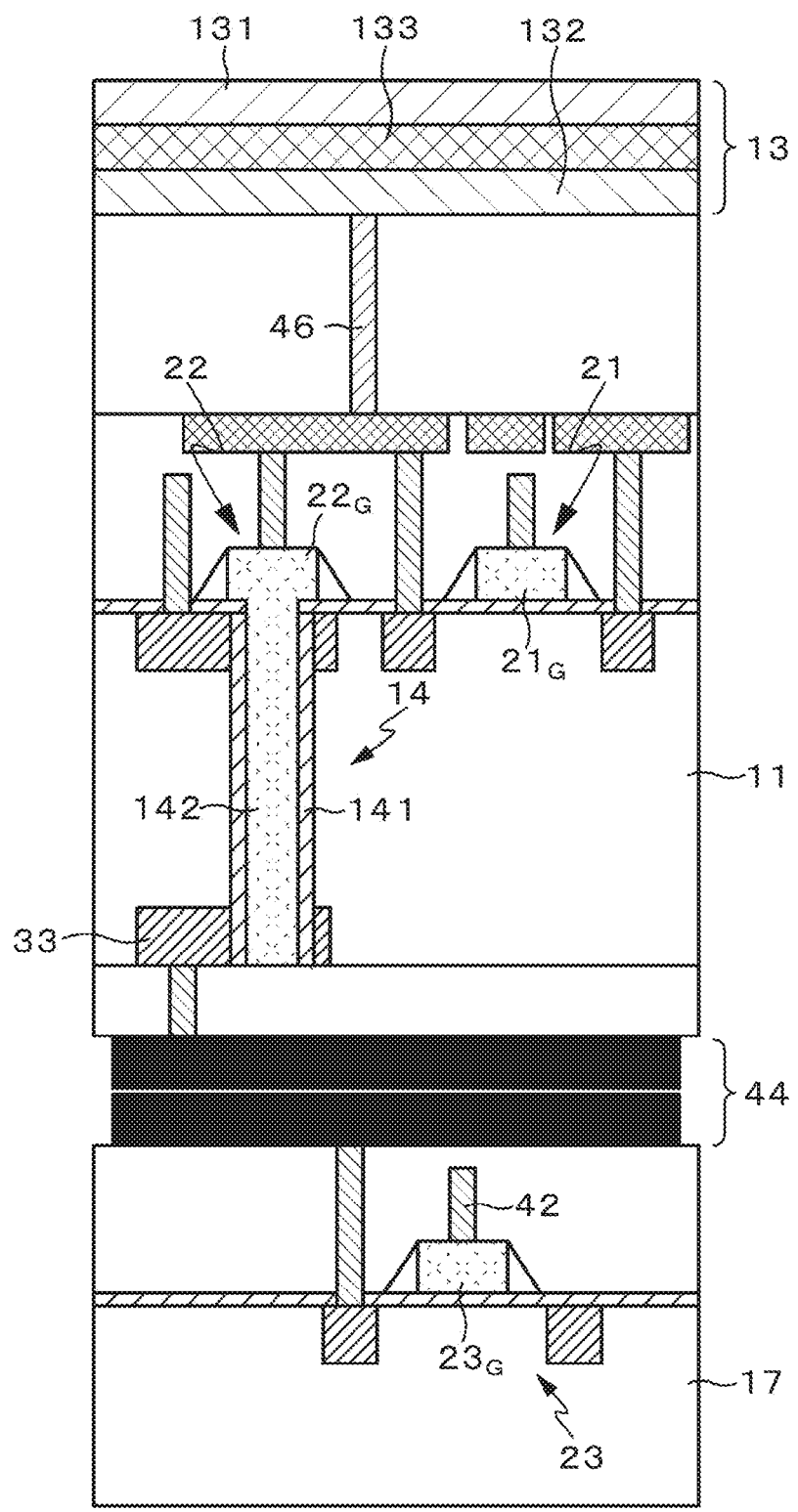
FIG. 5 is a cross-sectional view showing a solid-state imaging device of Embodiment 4.

Embodiment 4 is a modified example of Embodiment 1. FIG. 5 shows a cross-sectional view of a solid-state imaging device of Embodiment 4. In Embodiment 4, the photoelectric converter element 13 is disposed on the first surface side (back surface side) the semiconductor substrate 11, and a semiconductor substrate 17 is disposed on the second surface side (front surface side) thereof. The reset transistor 21 and the amplifier transistor 22 using the through-electrode 14 as a gate electrode are formed on the back surface side of the semiconductor substrate 11, i.e., on the photoelectric converter element 13 side. Further, the selection transistor 23 is formed on the semiconductor substrate 17 on the front surface side. The semiconductor substrate 11 and the semiconductor substrate 17 are electrically connected to each other via a connection electrode 44 such as a bump.

In such a manner, when the semiconductor substrate 17 that is different from the main semiconductor substrate 11 is used, and an element (in this embodiment, selection transistor 23) forming the pixel 10 is formed on the semiconductor substrate 17, the size of a region of the pixel 10 to be formed can be made small by the size of the selection transistor 23 that is not formed. This enables further miniaturization of the pixel 10.

Embodiment 5

Figure 6A:
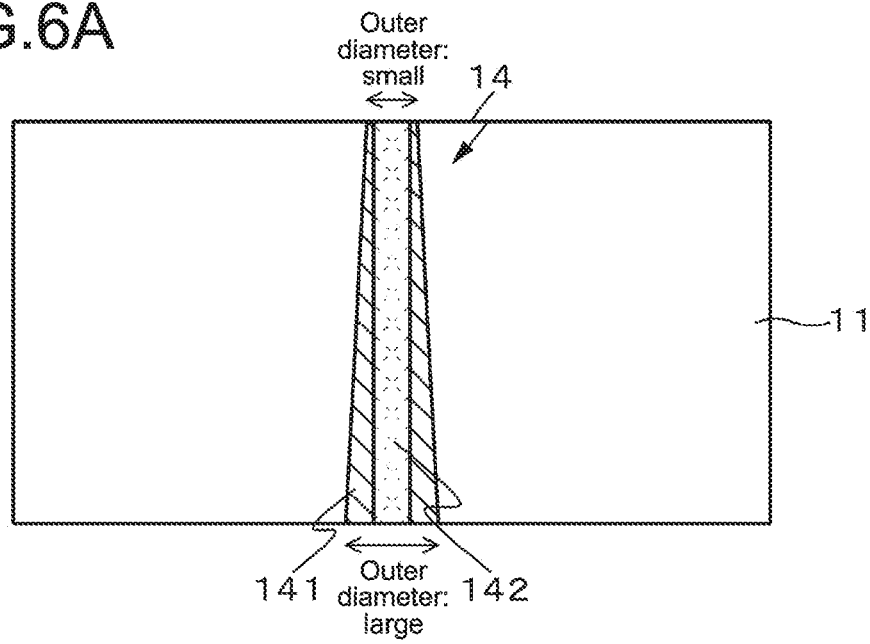
FIG. 6A is a cross-sectional view of a solid-state imaging device of a first example of Embodiment 5.
Figure 6B:
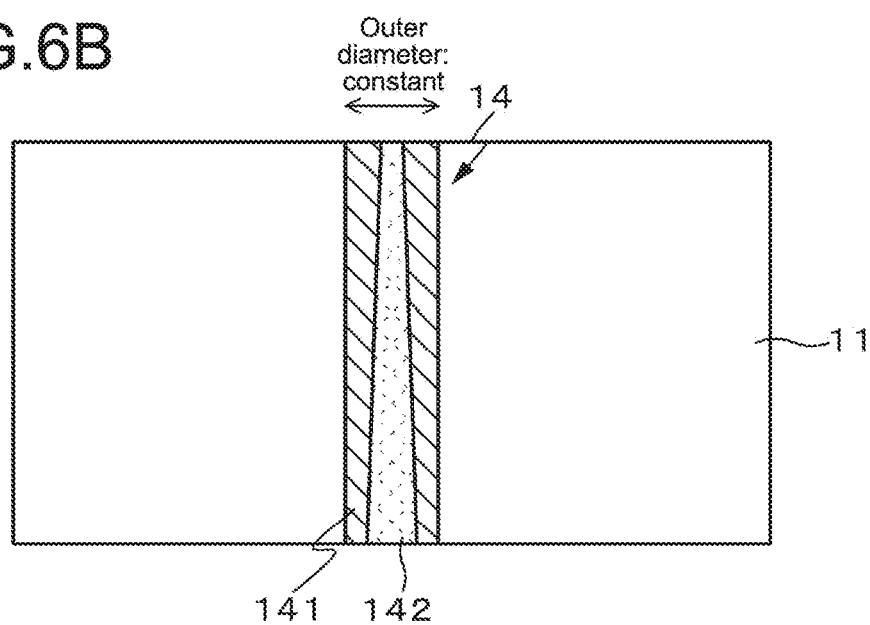
FIG. 6B is a cross-sectional view of a solid-state imaging device of a second example of Embodiment 5.

Embodiment 5 is a modified example of Embodiment 1 to Embodiment 4. FIG. 6A shows a cross-sectional view of a solid-state imaging device of a first example of Embodiment 5, and FIG. 6B shows a cross-sectional view of a solid-state imaging device of a second example of Embodiment 5.

In the first example of Embodiment 5, the through-electrode 14 is formed such that the electric conductor 142 has a constant thickness in the depth direction of the semiconductor substrate 11, and the insulating film 141 around the electric conductor 142 has a film thickness that changes in the depth direction of the semiconductor substrate 11. Accordingly, the cross-sectional shape of the insulating film 141 has a tapered shape having a small film thickness on one surface side of the semiconductor substrate 11 and a large film thickness on the other surface side thereof. The angle of the tapered shape is, for example, in the range of 90 degrees to 70 degrees. In the case of the through-electrode 14 of the first example, the through-electrode 14 has a shape in which the outer diameter (thickness) thereof changes in the depth direction of the semiconductor substrate 11.

Meanwhile, in the case of the through-electrode 14 of the second example of Embodiment 5, the outer diameter of the through-electrode 14 is constant in the depth direction of the semiconductor substrate 11. With the constant outer diameter of the through-electrode 14, the electric conductor 142 is formed such that the thickness thereof changes in the depth direction of the semiconductor substrate 11. Accordingly, the insulating film 141 around the electric conductor 142 is formed such that the film thickness thereof changes in the depth direction of the semiconductor substrate 11.

In such a manner, in either case of the through-electrode 14 of the first example and the through-electrode 14 of the second example, the insulating film 141 has a shape having a small film thickness on one surface side of the semiconductor substrate 11 and a large film thickness on the other surface side thereof. In such a manner, when the film thickness of the insulating film 141 around the electric conductor 142 is changed in the depth direction of the semiconductor substrate 11, i.e., caused to differ depending on a position in the depth direction, the entire capacitance of the through-electrode 14 can be reduced, and thus conversion efficiency for converting the charge from the photoelectric converter element 13 into an electrical signal can be improved.

Embodiment 6

Embodiment 6 relates to a method of manufacturing the solid-state imaging device of Embodiment 1. FIGS. 7A to 8B show process charts of a method of manufacturing the solid-state imaging device according to Embodiment 6. Further, the solid-state imaging devices of Embodiment 2 to Embodiment 5 can also be manufactured by combining the manufacturing method to be described below with a known method of manufacturing a semiconductor device.

Hereinafter, a process after a well of a first conductivity type, a photodiode of a second conductivity type, and the like (not shown) are formed in the semiconductor substrate 11 will be described. As a material of the semiconductor substrate 11, various semiconductor materials such as a chemical compound material and an organic semiconductor material can be used, in addition to the silicon material.

Figure 7A:
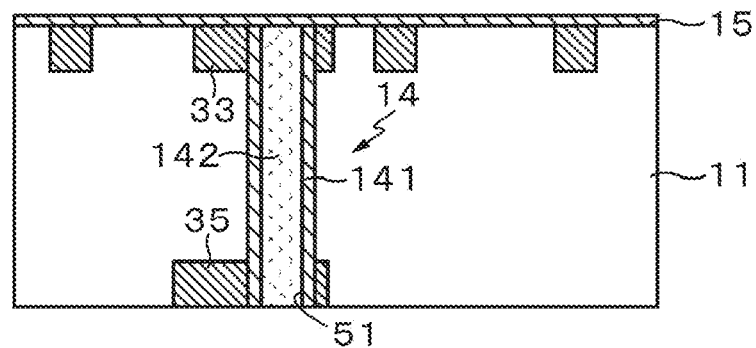
FIG. 7A, FIG. 7B, and FIG. 7C are process charts (part 1) of a method of manufacturing a solid-state imaging device according to Embodiment 6.

In the process of FIG. 7A, a through-hole 51 for the through-electrode 14 is formed by dry etching or the like, and the gate oxide film (insulating film) 15 is formed. The through-hole 51 can also be used as a mark for enhancing the accuracy of superposition between the front surface side and the back surface side of the semiconductor substrate 11. Further, the through-hole 51 can also be formed simultaneously with a vertical transistor for transfer, as described in Japanese Patent Application Laid-open No. 2008-66742. The source region (diffusion layer 33) and the drain region (diffusion layer 35) of the amplifier transistor 22 can be formed before the through-hole 51 is formed. The source region (diffusion layer 33) and the drain region (diffusion layer 35) of the solid-state imaging device of Embodiment 3 can be formed by angled ion implantation performed on the side wall of the through-hole 51.

Figure 7B:
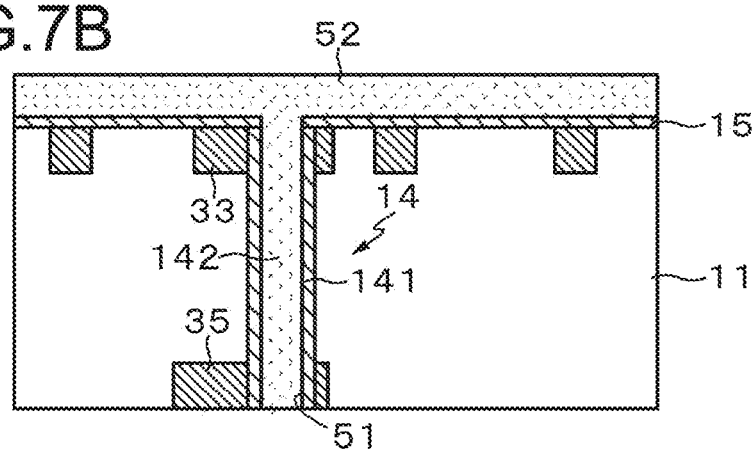

Next, in the process of FIG. 7B, the material of the electric conductor 142 of the through-electrode 14, which is to be a gate electrode of the amplifier transistor 22, i.e., a metal material (electrically conductive material) is embedded in the through-hole 51 and is also deposited on a flat surface portion of the semiconductor substrate 11 at the same time.

Figure 7C:
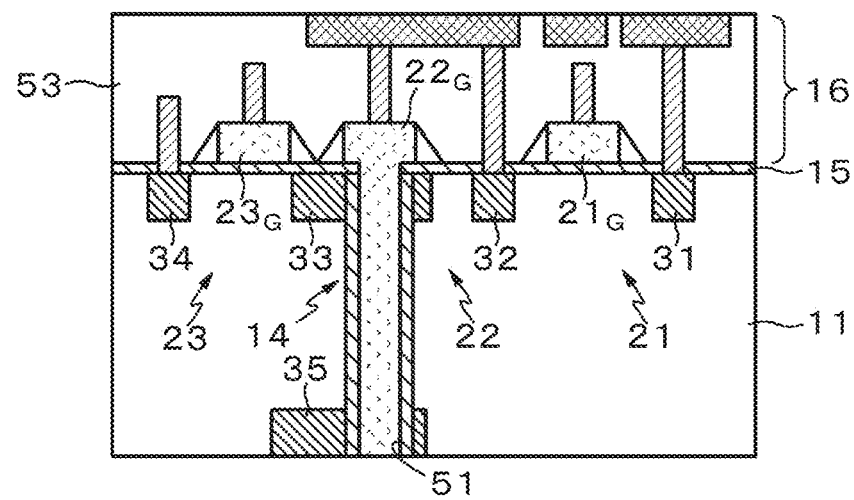

Next, in the process of FIG. 7C, the gate electrode $21_G$ of the reset transistor 21, the gate electrode $22_G$ of the amplifier transistor 22, and the gate electrode $23_G$ of the selection transistor 23 are processed and formed by dry etching. Subsequently, the side wall, the diffusion layer 31, the diffusion layer 32, the diffusion layer 34 that are to be the source region and the drain region, and the like are formed, and annealing treatment is performed. An interlayer insulating film 53 is then deposited, and the wiring layer 16 is formed.

Figure 8A:
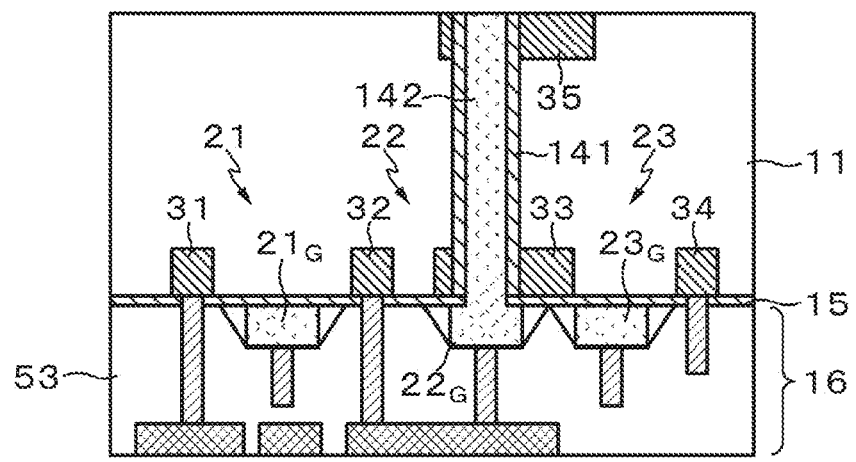
FIG. 8A and FIG. 8B are process charts (part 2) of the method of manufacturing a solid-state imaging device according to Embodiment 6.

Next, in the process of FIG. 8A, a support substrate, another semiconductor base, or the like (not shown) is bonded to the front surface side of the semiconductor base 11 and is inverted upside down. Subsequently, after the semiconductor substrate 11 is thinned to expose the through-electrode 14, the insulating film 142 is formed so as to avoid short-circuit between the semiconductor base 11 and the through-electrode 14. For formation of the insulating film 142, for example, the technology described in Japanese Patent Application Laid-open No. 2012-175067 can be used.

Figure 8B:
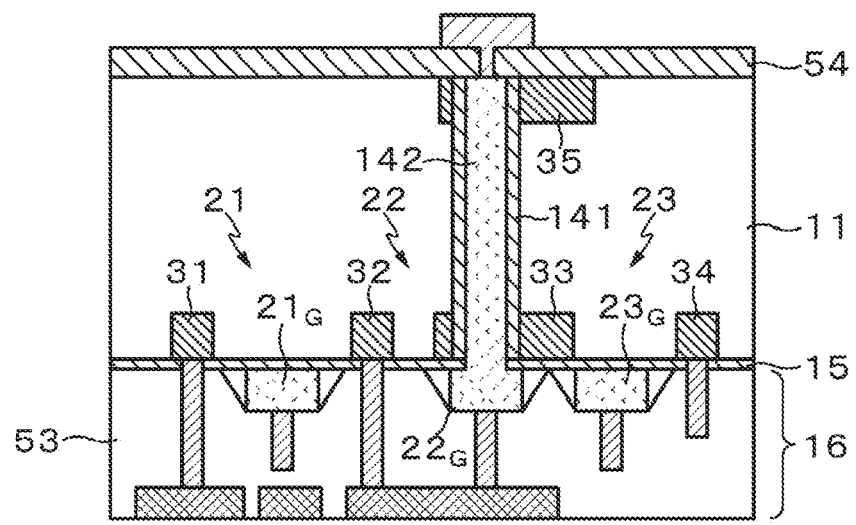

Next, in the process of FIG. 8B, a film 54 having negative fixed charge is laminated. Here, it is also possible to laminate a film having two or more types of negative fixed charge. Subsequently, an interlayer insulating film is deposited, a contact is formed by dry etching, and the photoelectric converter element 13 is laminated (see FIG. 1). A protective film of silicon nitride or the like may be formed on the upper portion of the photoelectric converter element 13. Subsequently, an optical member of a flat film or the like is formed, and an on-chip lens is formed.

REFERENCE EXAMPLE

Figure 9A:
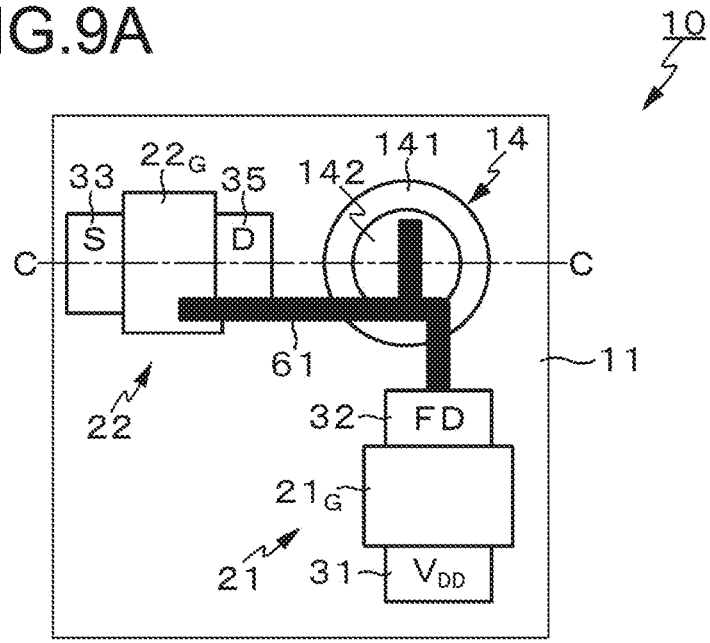
FIG. 9A is a plan view of a solid-state imaging device of a reference example.
Figure 9B:
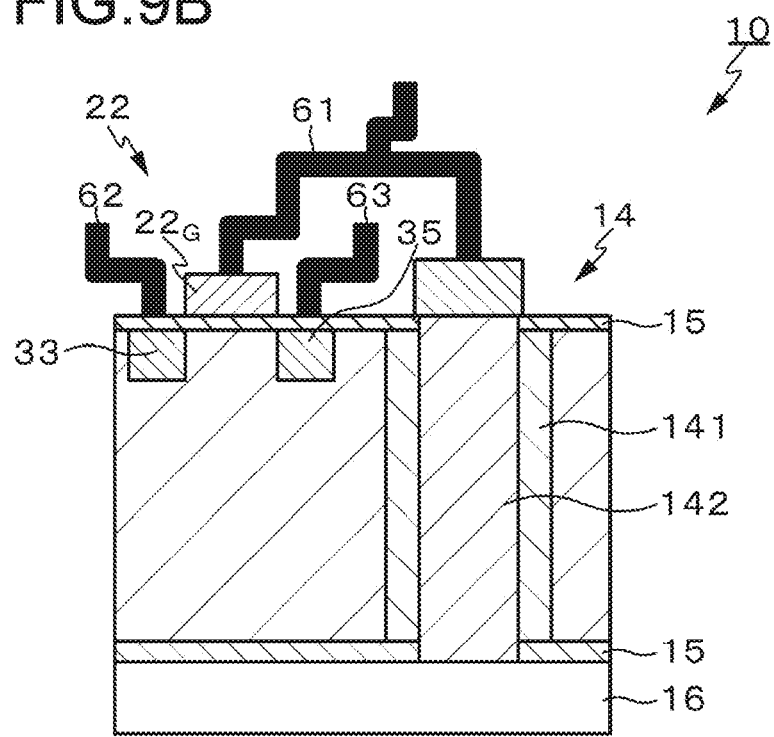
FIG. 9B is a cross-sectional side view taken along the line C-C of FIG. 9A.

Here, a basic configuration where the through-electrode 14 and the transistors forming the pixel 10 are provided in combination without using the technology of the present disclosure will be described as a reference example. FIG. 9A shows a plan view of a solid-state imaging device of a reference example, and FIG. 9B shows a cross-sectional side view thereof. FIG. 9B is a cross-sectional side view taken along the line C-C of FIG. 9A.

In the TCV technology to perform electrical connection by the through-electrode 14, in a case where ere the through-electrode 14 and the transistors forming the pixel 10 are provided in combination, transistor characteristics are deteriorated because amplification characteristics and noise characteristics are dependent on the size of the transistors. Further, an earth capacitance between the through-electrode and the semiconductor substrate, and a wiring capacitance between the through-electrode and the transistor are increased.

FIGS. 9A and 9B exemplify, as the transistors forming the pixel 10, the reset transistor 21 that resets the floating diffusion FD, and the amplifier transistor 22 that outputs an electrical signal (pixel signal) obtained by charge-voltage conversion in the diffusion FD.

In the solid-state imaging device of the reference example, the through-electrode 14 and the amplifier transistor 22 are provide separately from each other, thus ensuring a sufficient separation structure between the through-electrode 14 and the amplifier transistor 22. The gate electrode $22_G$ of the amplifier transistor 22 and the through-electrode 14 are then electrically connected to each other by a wire 61.

Embodiment 7

Figure 10A:
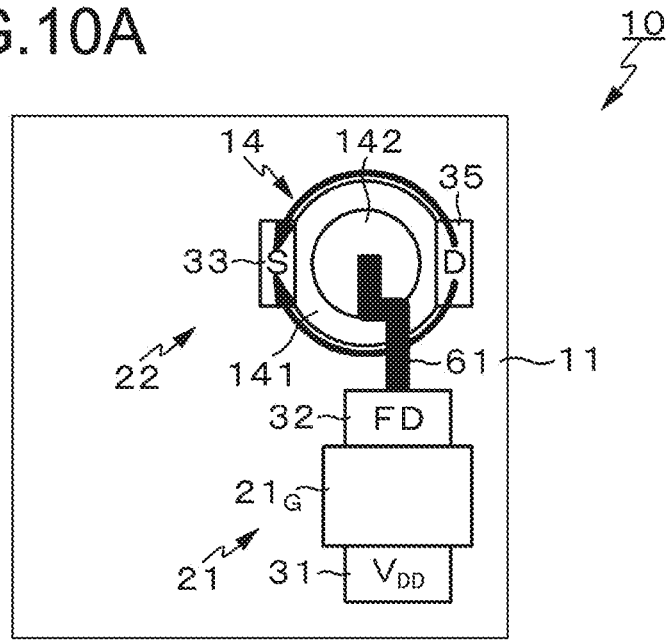
FIG. 10A is a plan view of a solid-state imaging device of Embodiment 7.
Figure 10B:
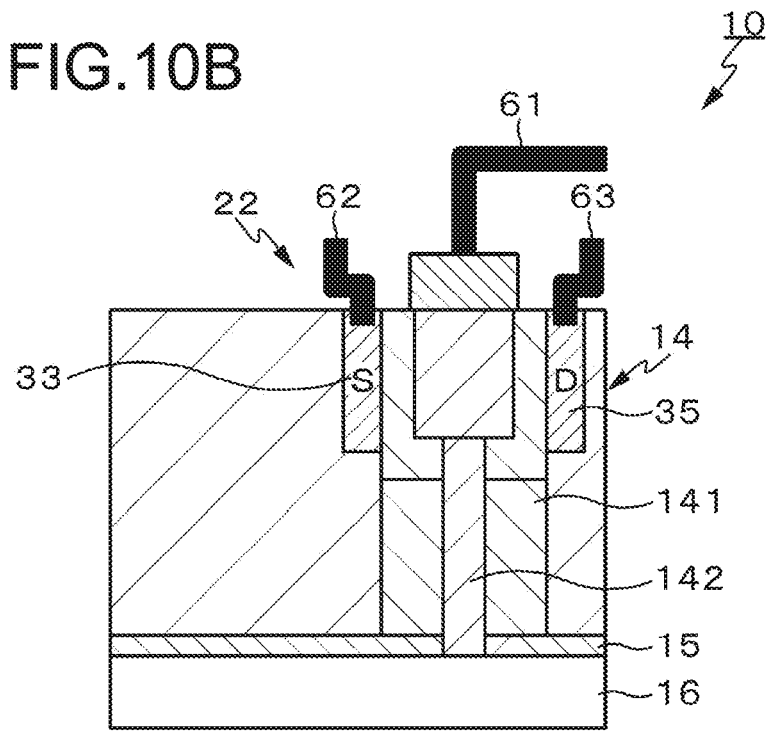
FIG. 10B is a cross-sectional side view of the solid-state imaging device of Embodiment 7.

Embodiment 7 relates to a solid-state imaging device corresponding to the solid-state imaging device of the reference example, i.e., a solid state imaging device in a case of using the technology of the present disclosure. FIG. 10A shows a plan view of the solid-state imaging device of Embodiment 7, and FIG. 10B shows a cross-sectional side view thereof.

A structure of the solid-state imaging device of Embodiment 7 is basically the same as the structure of the solid-state imaging device of Embodiment 1. However, the solid-state imaging device of Embodiment 1 has the configuration in which, regarding the amplifier transistor 22 formed using the through-electrode 14, the diffusion layer 33 to be a source region (hereinafter, referred to as "source region 33" in some cases) is disposed on the front surface side of the semiconductor substrate 11, and the diffusion layer 35 to be a drain region (hereinafter, referred to as "drain region 35" in some cases) is disposed on the back surface side of the semiconductor substrate 11.

In contrast to this, the solid-state imaging device of Embodiment 7 has a configuration in which the source region 33 and the drain region 35 are both disposed on the front surface side of the semiconductor substrate 11. In other words, the solid-state imaging device of Embodiment 7 is a vertical transistor in which the source region 33, the drain region 35, and a channel region are formed at a part of the semiconductor on the side surface of the through-electrode 14, and a channel width is set to the depth direction (vertical direction) of semiconductor substrate 11.

Here, for easy understanding, one type of separation in which the source region 13, the drain region 35, and the channel region are formed in the vicinity of the front surface side of the simplest substrate, and a configuration of the electric conductor 142 are exemplified, but this does not apply to a positional relationship and the configurations thereof.

As is apparent from the comparison between FIGS. 9A and 9B and FIGS. 10A and 10B, in Embodiment 7, the gate electrode $22_G$ for the amplifier transistor 22 and the wire 61 that electrically connects the gate electrode $22_G$ and the through-electrode are not provided. Instead, the source region 33 and the drain region 35 that are positioned in the vicinity of the gate electrode $2_G$ for the amplifier transistor 22, and a wire 62 and a wire 63 therefor, are disposed on the side surface of the through-electrode 14, which is avoided for the purpose of the separation of the through-electrode 14 and the semiconductor substrate 11 in the reference example.

Accordingly, the areas for the elements that becomes unnecessary or areas that have not been used from the beginning can be used, and the pixel 10 having a smaller area can be designed. Further, the gate electrode $22_G$ and the wires 61 to 63 in the solid-state imaging device of the reference example become unnecessary, and thus the wiring capacitance of the amplifier transistor 22 can be reduced. Additionally, the channel width of the amplifier transistor 22 formed in the depth direction of the semiconductor substrate 11 along both side surfaces of the through-electrode 14. According the channel width of the amplifier transistor 22 can be freely designed to be expanded without disadvantages such as an increase in area occupied by the layout, and thus favorable transistor characteristics can be obtained. Additionally for the channel length of the amplifier transistor 22, as shown in FIG. 10A, the outer circumference of the through-electrode 14 can be used. Accordingly, as compared with a normal surface (flat surface) transistor, the channel length can be designed to be large with good area efficiency.

Embodiment 8

Figure 11A:
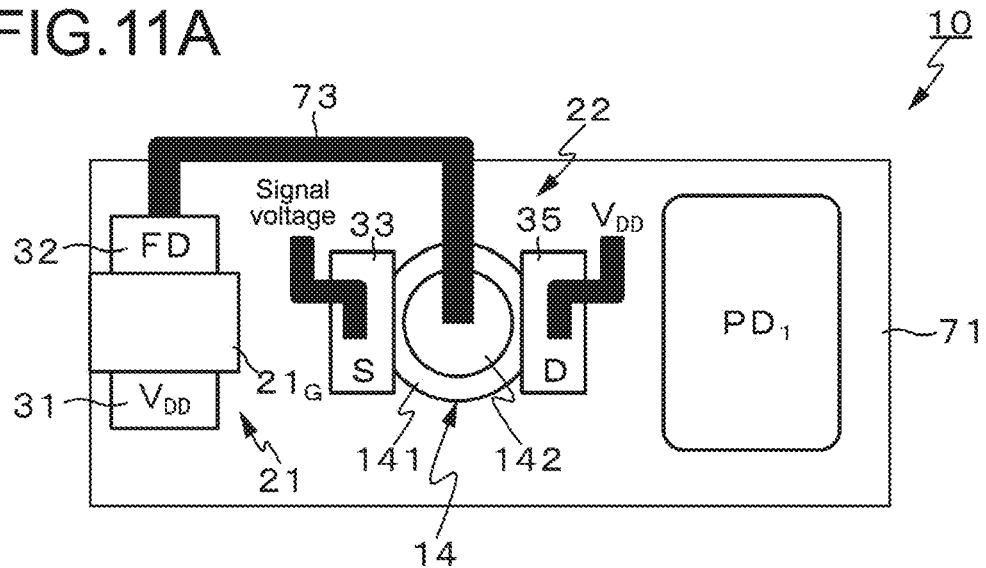
FIG. 11A is a plan view of a solid-state imaging device of Embodiment 8.
Figure 11B:
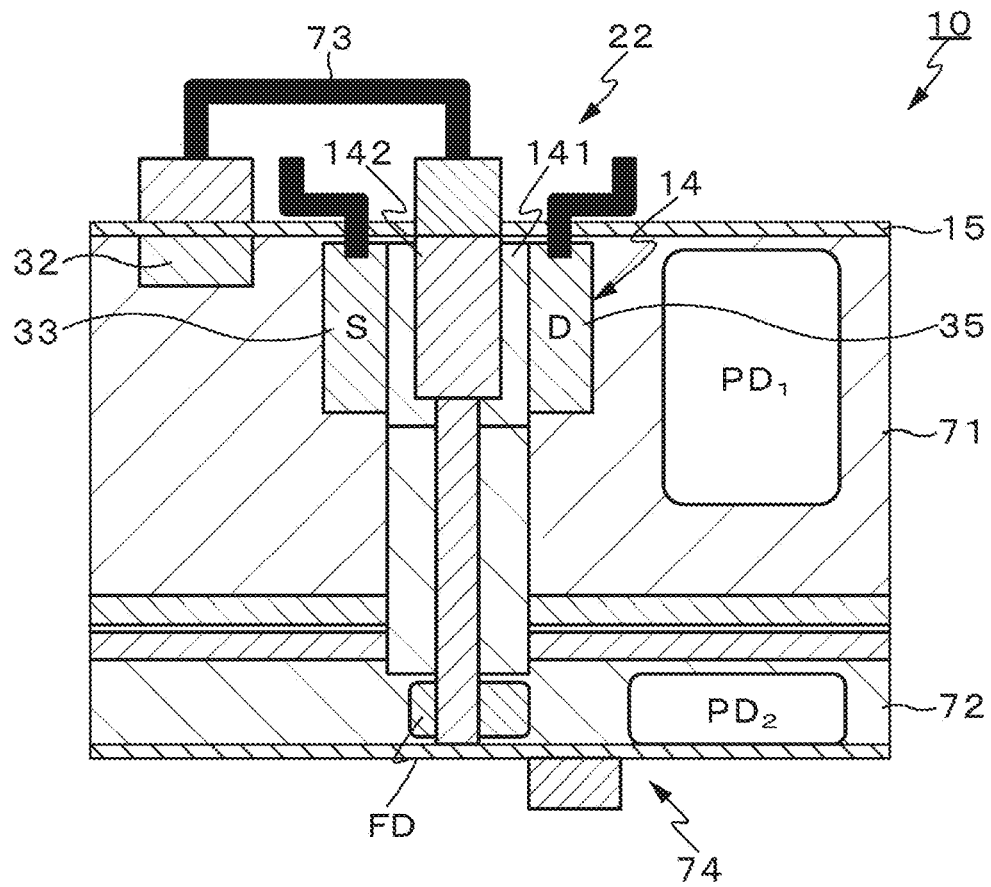
FIG. 11B is a cross-sectional side view of the solid-state imaging device of Embodiment 8.

Embodiment 8 relates to an electronic-conversion-type backside illumination solid-state imaging device using vertical dichroic spectroscopy. FIG. 11A shows a plan view of the solid-state imaging device of Embodiment 8, and FIG. 11B shows a cross-sectional side view thereof.

The solid-state imaging device of Embodiment 8 has a structure in which a first semiconductor substrate 71 and a second semiconductor substrate 72 are bonded to each other. In the first semiconductor substrate 71, a photoelectric converter element teat photoelectrically converts light having a relatively long wavelength, which comes from the lower direction of the figure, for example, a photodiode $PD_1$ is formed. Additionally, in the first semiconductor substrate 71, the reset transistor 21 that resets the floating diffusion FD, the through-electrode 14, the amplifier transistor 22 that uses the electric conductor 142 of the through-electrode 14 as a gate electrode, and a wire 73 therefor are formed. Although not illustrated for the purpose of simplicity, the first semiconductor substrate 71, a plurality of transistors that hold, read, amplify, and select charge (electron) photoelectrically converted in the photodiode $PD_1$ are further formed.

The second semiconductor substrate 72 is bonded to the first semiconductor substrate 71 so as to be positioned in a light incident direction (lower direction of the figure) of the first semiconductor substrate 71. In the second semiconductor substrate 72, a photoelectric converter element, for example, a photodiode $PD_2$ is formed in a process different from the first semiconductor substrate 71. In the second semiconductor substrate 72, a read transistor 74 that reads charge photoelectrically converted in the photodiode $PD_2$ to the floating diffusion FD, and a wired therefor are further formed. Although not illustrated for the purpose of simplicity, in the second semiconductor substrate 72, an on-chip lens, a filter for obtaining desired wavelength characteristics, and the like are further formed.

In the solid-state aging device of Embodiment 8 having the above-mentioned configuration, the floating diffusion FD formed in the second semiconductor substrate 72, and the through-electrode 14 that functions as the gate electrode of the amplifier transistor 22 are electrically connected to each other by the wire 73 formed in a near-field region of the amplifier transistor 22. Accordingly, the solid-state imaging device of Embodiment 8 becomes an electronic-conversion-type backside illumination solid-state imaging device using vertical dichroic spectroscopy.

In the electronic-conversion-type backside illumination solid-state imaging device using vertical dichroic spectroscopy, light having a relatively short wavelength is photoelectrically converted in the photodiode $PD_2$ formed in the lower-side second semiconductor substrate 72. The charge photoelectrically converted in the photodiode $PD_2$ is read by the read transistor 74 and held in the floating diffusion FD. When the potential of the through-electrode 14 is then changed by the charge, which is held in the floating diffusion FD and corresponds to the amount of incident light, an electrical signal (pixel signal) corresponding to the charge obtained by the photoelectric conversion can be read to the first semiconductor substrate 71.

In the solid-state imaging device of Embodiment 8 having the configuration described above, the amplification or selective drive of the potential of the through-electrode 14, i.e., the potential corresponding to the amount of light received on the short wavelength side are performed in the first semiconductor substrate 71. Accordingly, the lower-side second semiconductor substrate 72 can be configured with a small amount of elements, and thus a light-receiving area of the photodiode $PD_2$ can be widely set. Additionally, regarding the elements necessary for the upper-side first semiconductor substrate 71, the through-electrode 14 also serves as the gate electrode of the amplifier transistor 22. Thus, area efficiency of the pixel 10 is good, and the transistor characteristics can also be favorably ensured.

It should be noted that the case where the N-type channel transistor is formed has been described here as an example, but a P-type channel transistor may be formed depending on the configuration or design of the elements within the first semiconductor substrate 71 and the second semiconductor substrate 72. As a source region and a drain region therefor, it is conceivable that an N-type semiconductor, a P-type semiconductor, and metal are used as constituent materials. Further, for the first semiconductor substrate 71 and the second semiconductor substrate 72, the material is not necessarily limited to a silicon material generally used and is feasible with any other semiconductor materials such as a chemical compound material and an organic semiconductor material.

Embodiment 9

Figure 12A:
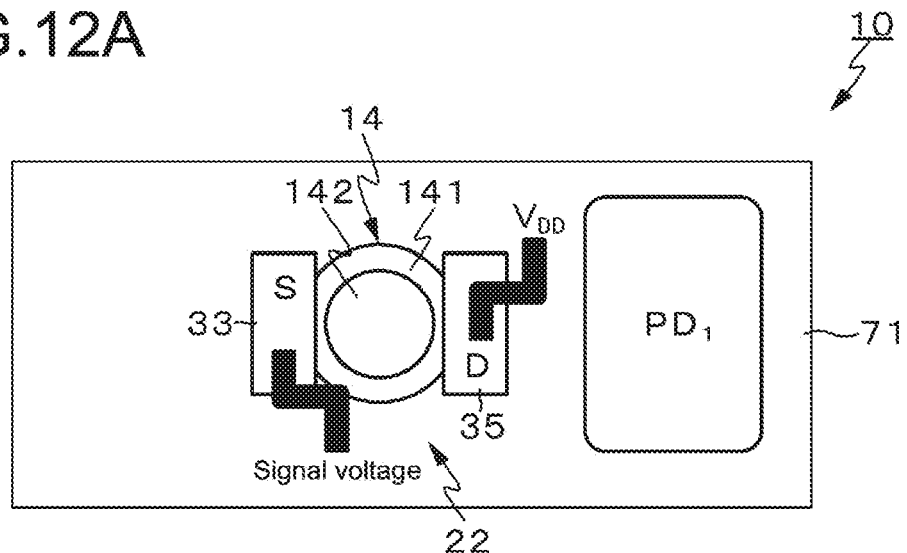
FIG. 12A is a plan view of a solid-state imaging device of Embodiment 9.
Figure 12B:
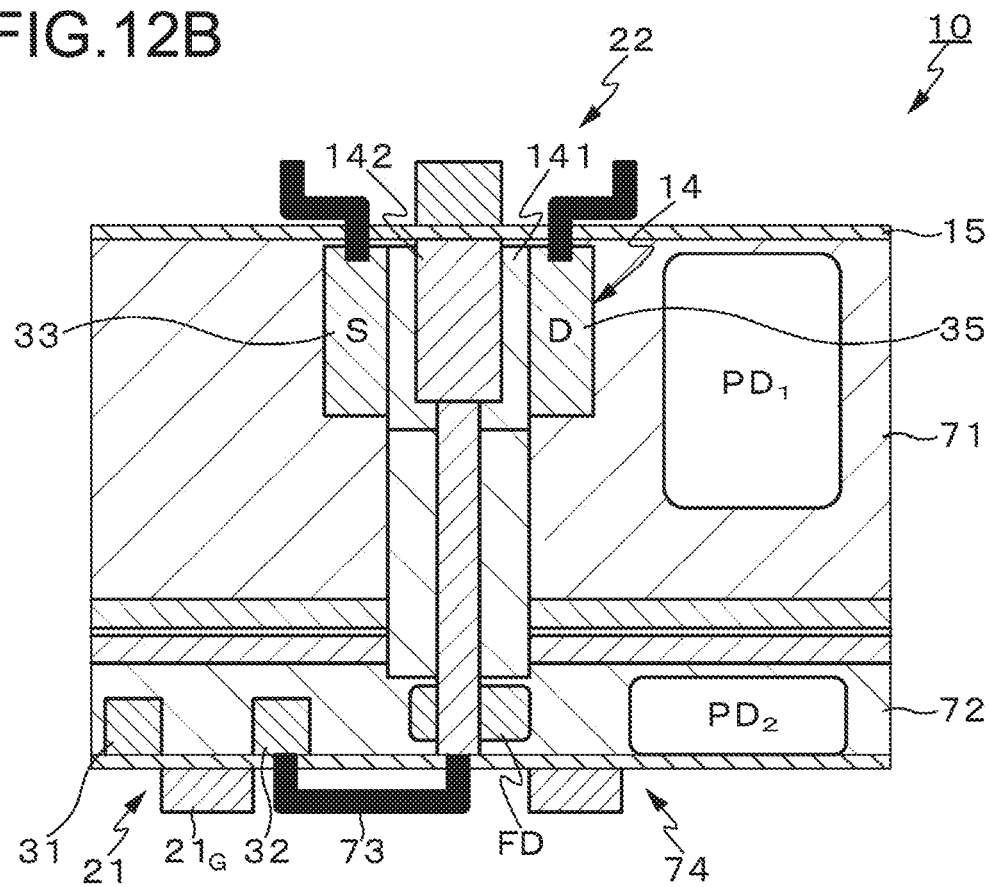
FIG. 12B is a cross-sectional side view of the solid-state imaging device of Embodiment 9.

Embodiment 9 is a modified example of Embodiment 8. FIG. 12A shows a plan view of a solid-state imaging device of Embodiment 9, and FIG. 12B shows a cross-sectional side view thereof.

Embodiment 8 has the configuration in which the wire 73 is connected to the through-electrode 14 on the surface side of the first semiconductor substrate 71, on which the amplifier transistor 22 is formed. In contrast to this, Embodiment 9 has a configuration in which the wire 73 is connected to the through-electrode 14 from the second semiconductor substrate 72 on the short wavelength side. Accordingly, the reset transistor 21 can be formed on a surface different from the surface of the first semiconductor substrate 71, on which the amplifier transistor 22 is formed, or can be formed on the second semiconductor substrate 72, and thus the degree of freedom in layout of the elements forming the pixel 10 can be improved.

Embodiment 10

Figure 13A:
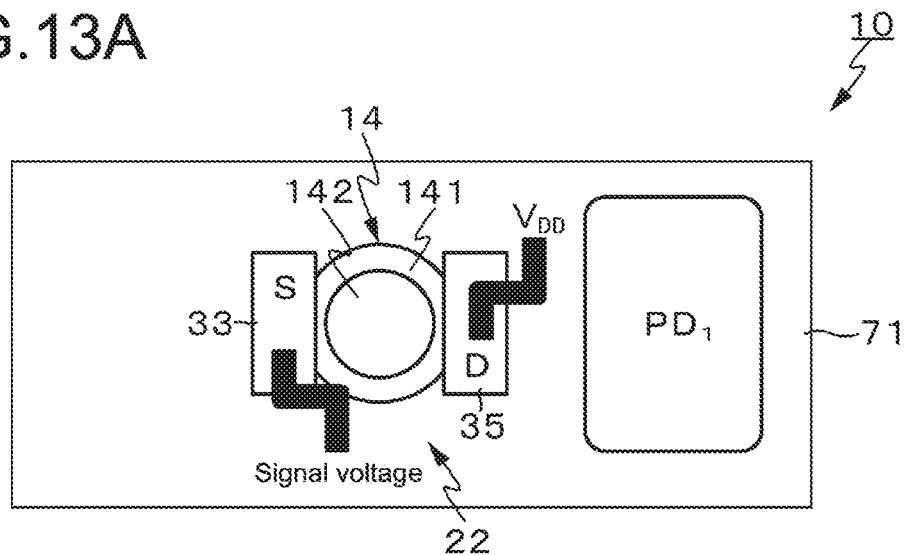
FIG. 13A is a plan view of a solid-state imaging device of a first example of Embodiment 10.
Figure 13B:
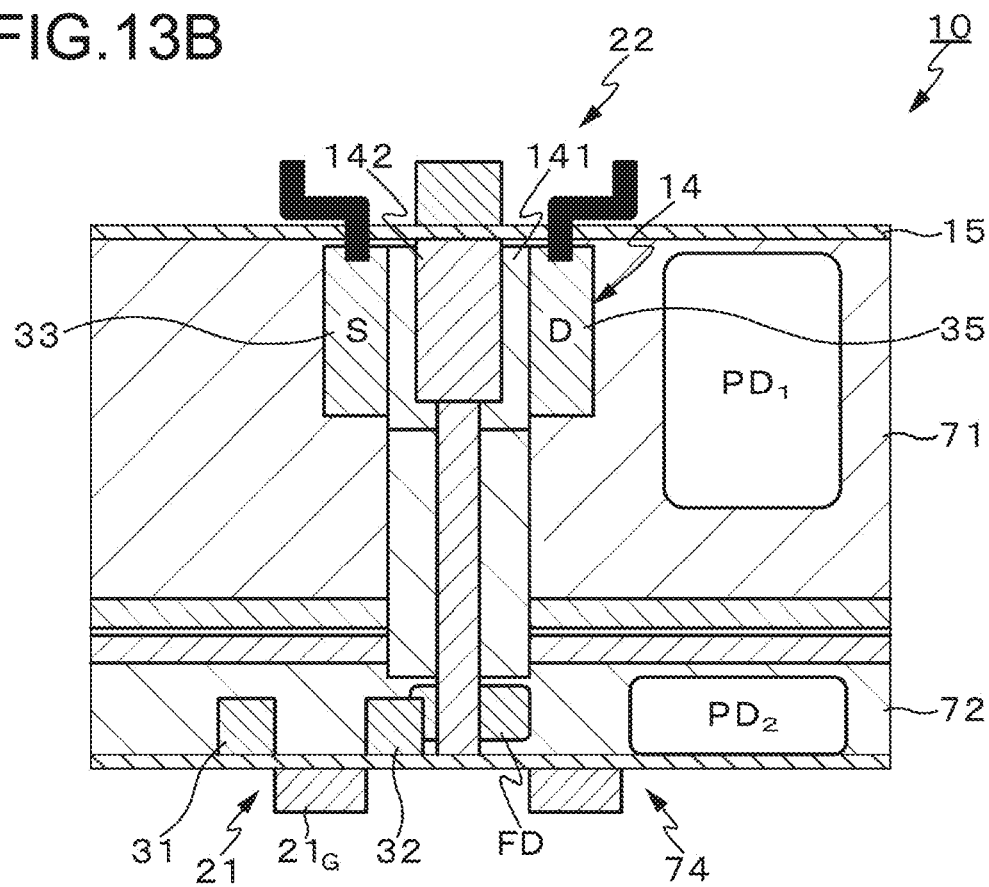
FIG. 13B is a plan view of a solid-state imaging device of a second example of Embodiment 10.

Embodiment 10 is a modified example of Embodiment 9. FIG. 13A shows a plan view of a solid-state imaging device of Embodiment 10, and FIG. 13B shows a cross-sectional side view thereof.

Embodiment 9 has the configuration in which the source region (diffusion layer 32) of the reset transistor 21 and the floating diffusion FD on the second semiconductor substrate 72 side are electrically connected to each other by the wire 73 of the through-electrode 14. In contrast to this Embodiment 10 has a configuration in which the floating diffusion FD on the second semiconductor substrate 72 side is used as a source region (diffusion layer 32) of the reset transistor 21. Accordingly, since the wire 73 of the through-electrode 14 or the contact can be eliminated, the degree of freedom in layout of the elements forming the pixel 10 can further be improved.

Embodiment 11

Figure 14A:
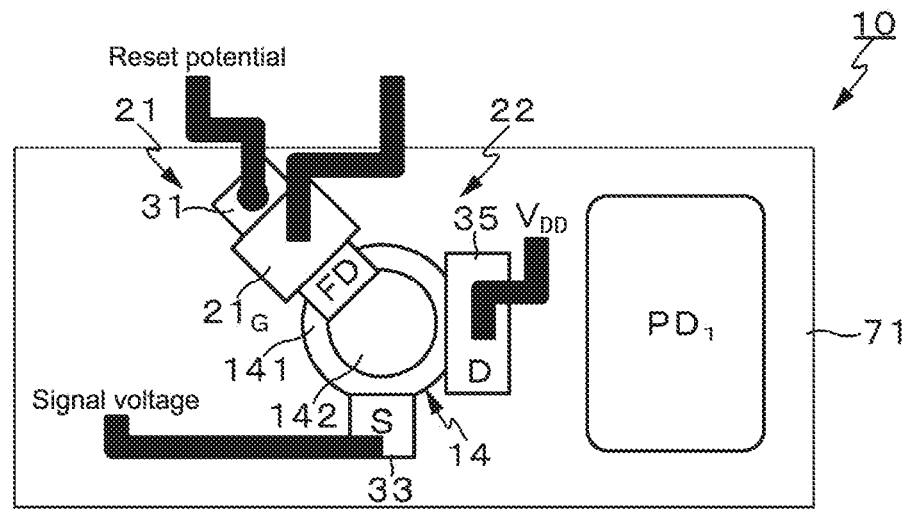
FIG. 14A is a cross-sectional side view of a solid-state imaging device of a first example of Embodiment 11.
Figure 14B:
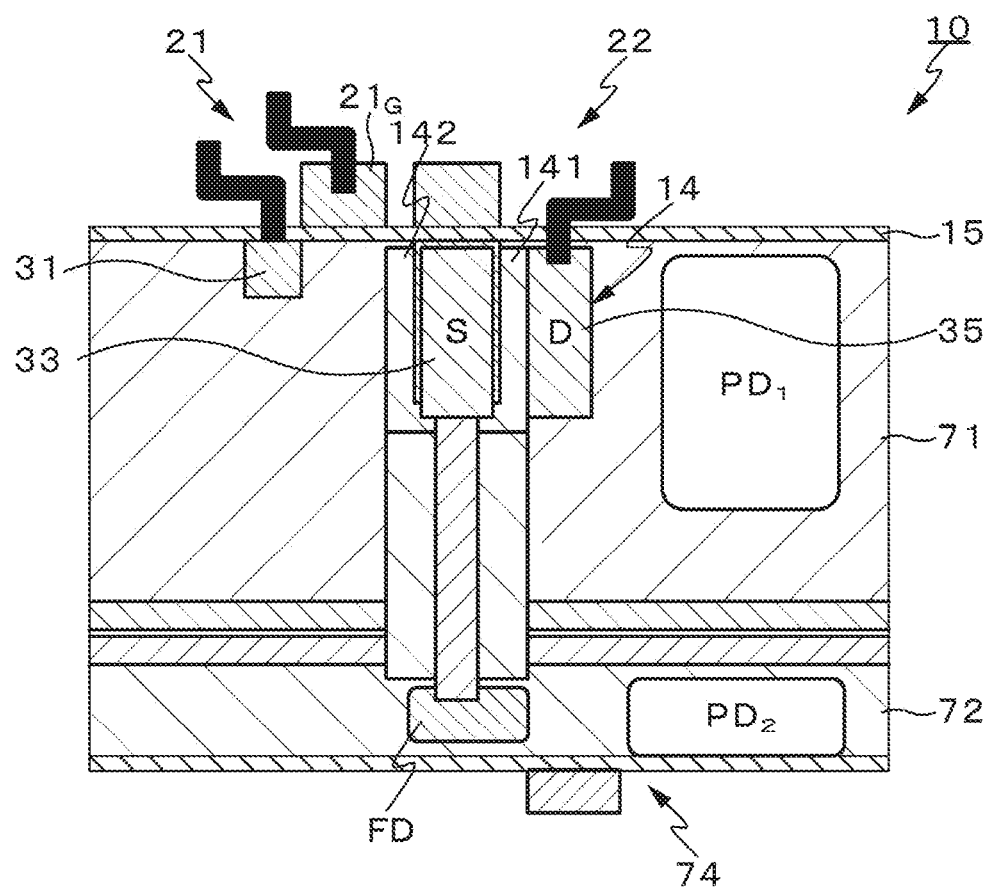
FIG. 14B is a cross-sectional side view of a solid-state imaging device of a second example of Embodiment 11.

Embodiment 11 is a modified example of Embodiment 8. FIG. 14A shows a plan view of a solid state imaging device of Embodiment 11, and FIG. 14B shows a cross-sectional side view thereof.

It is not necessary to completely insulate the through-electrode 14 and the first semiconductor substrate 71 from each other all the regions. When the through-electrode 14 and the first semiconductor substrate 71 are partial uninsulated from each other and electrically connected to each other, the potential of the through-electrode 14 can be fixed without using the wire 73 of the though-electrode 14.

Embodiment 11 has a configuration in which the drain region 35 and the source region 33 of the amplifier transistor 22 are disposed not diagonally in a circumferential direction of the through-electrode 14, but, for example, in the direction of 3 o'clock and the direction of 6 o'clock on an arc, and the through-electrode 14 and the floating diffusion FD on the first semiconductor substrate 71 side are electrically connected to each other in the direction of 10:30 o'clock. Here, "the direction of 3 o'clock", "the direction of 6 o'clock", and "the direction of 10:30 o'clock" include, in addition to the cases of indicating "the direction of 3 o'clock", "the direction of 6 o'clock", and "the direction of 10:30 o'clock" in a precise sense, cases of indicating substantially the direction of 6 o'clock and the direction of 10:30 o'clock, and variations caused in design or manufacturing are permissible. The floating diffusion FD becomes a source region of the reset transistor 21 and forms a MOS transistor together with a drain region (diffusion layer 31) having a fixed potential and the gate electrode $21_G$.

In the solid-state imaging device of Embodiment 11 having the configuration described above, when the reset transistor 21 is set to a conductive state, the potential of the through-electrode 14 is reset to the fixed potential of the drain region 35. In such a manner, when the through-electrode 14 and the first semiconductor substrate 71 are partially uninsulated from each other and electrically connected to each other, the potential of the through-electrode 14 can be fixed without using the wire 73 of the through-electrode 14.

Embodiment 12

Figure 15A:
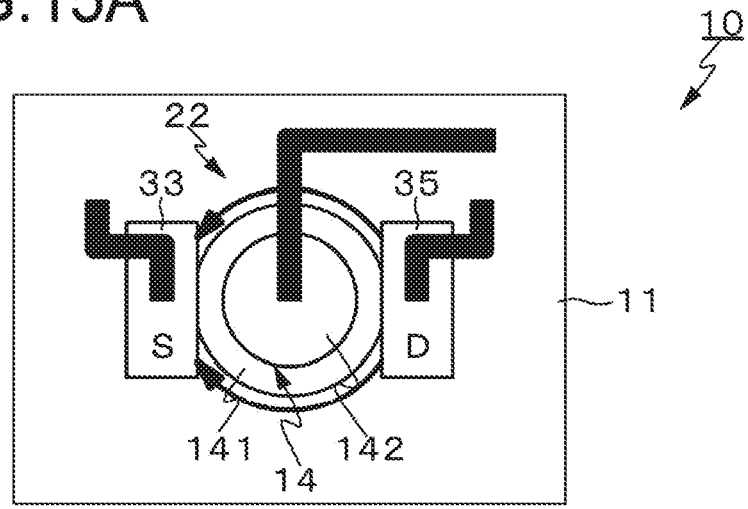
FIG. 15A is a plan view of a solid-state imaging device of Embodiment 12.
Figure 15B:
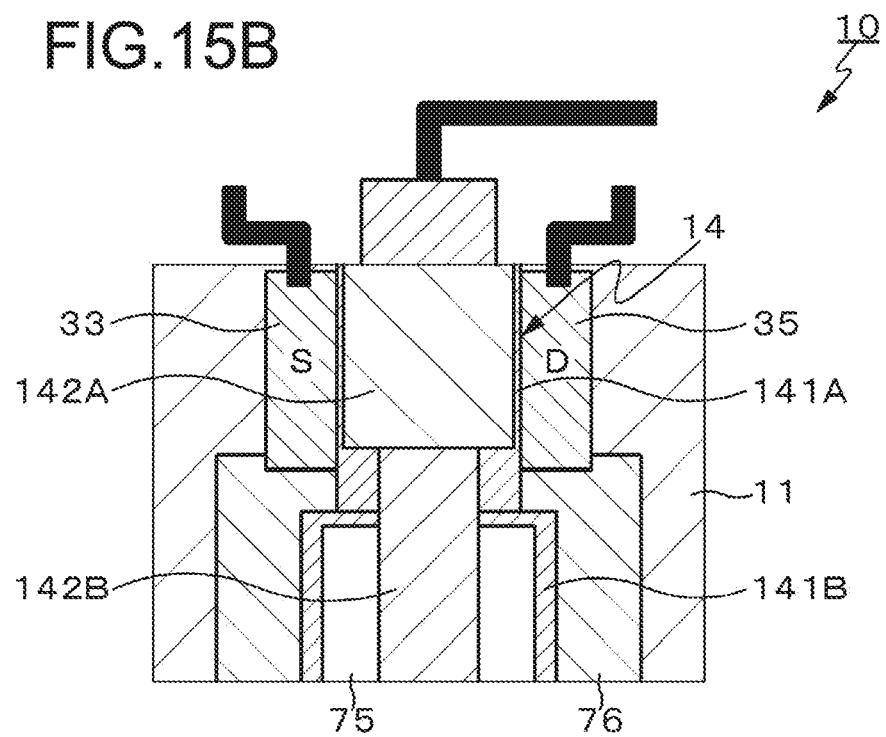
FIG. 15B is a cross-sectional side view of the solid-state imaging device of Embodiment 12.

Embodiment 12 relates to a solid-state imaging device having high-performance transistor operation and separation characteristics. FIG. 15A shows a plan view of a solid-state imaging device of Embodiment 12, and FIG. 15B shows a cross-sectional side view thereof. Here, a case of forming an N-type channel transistor will be taken as an example. However, the present disclosure is not limited to the formation of the N-type channel transistor.

In the through-electrode 14, the electric conductor 142 at the center thereof includes at least one layer in the length direction and is formed of at least one type of electrically conductive material. Specifically, for example, the electric conductor 142 includes a first electric conductor 142A and a second electric conductor 142B continuous with the first electric conductor 142A. The first electric conductor 142A functions as a gate electrode of the amplifier transistor 22 and has a work function that desirably sets the drying range of the amplifier transistor 22. The second electric conductor 142B has a smaller diameter than that of the first electric conductor 142A and is formed of an electrically conductive material having a higher work function than that of the first electric conductor 142A.

In the insulating film 141 that separates the electric conductor 142 and the semiconductor substrate 11 from each other, an upper insulating film 141A around the first electric conductor 142A and a lower insulating film 141B around the second electric conductor 142B are different from each other in the film thickness. Specifically, the upper insulating film 141A is thinner than the lower insulating film 141B and is formed of a material having a higher dielectric constant (high dielectric constant film) than that of the lower insulating film 141B.

Further, around the most part of the second electric conductor 142B on the lower side, the lower insulating film 141B formed of a low dielectric constant insulating film and forms a separation structure that electrically separates the second electric conductor 142B and the semiconductor substrate 11 from each other by the intervention of a vacancy 75 between the second electric conductor 142B and the semiconductor substrate 11. In other words, since the second electric conductor 142B has a smaller diameter than that of the first electric conductor 142A, a free area thus obtained is used for the separation. Accordingly, favorable amplification characteristics are obtained as a transistor operation of the amplifier transistor 22, and coupling between the semiconductor substrate 11 and the through-electrode 14 can be suppressed in a small area. Thus, the capacitance of the through-electrode 14 can be reduced.

In order to suppress generation of aliasing from the side surface of the damaged layer, it is favorable to apply fixed charge to the lower insulating film 141B formed of the low dielectric constant insulating film, to enhance accumulation. Alternatively, a fixed charge amount applied to the upper insulating film 141A around the first electric conductor 142A and a fixed charge amount applied to the lower insulating film 141B around the second electric conductor 142B are made different from each other. Further, on the semiconductor substrate 11 side, when p-type impurities are doped as needed, an effect of suppressing a dark current can be enhanced. In FIG. 12B, a region 76 is an accumulation doping region doped with the p-type impurities.

From the description above, the following actions and effects can be obtained.

1. In the amplifier transistor 22, a stable and favorable amplification operation can be performed within the driving range of a varying potential. This action and effect are achieved by the gate electrode (first electric conductor 142A) of the amplifier transistor 22, which has a work function for performing an operation within the driving range, the upper insulating film 141A formed of a high dielectric constant thin film, control of a channel shape/concentration, and suppression of capacitance variations of the transistor.

2. In other than the amplifier transistor 22, it is possible to suppress coupling between the elements within the semiconductor substrate 11, suppress the capacitance of the through-electrode 14, or suppress generation of a dark current. Those are achieved by sufficient separation (film thickness, low dielectric constant) between the side surface of the through-electrode 14 and the semiconductor substrate 11, sufficient accumulation doping in the semiconductor region on the side surface, an electric conductor with a work function, application of fixed charge, and the like.

Here, the semiconductor material is not particularly limited, but a semiconductor including at least Si, Ge, Ga, In, or Zn can be exemplified as a representative material. As another constituent element, Al, P, S, Cl, Cu, As, Se, Cd, Sn, Sb, or the like can be exemplified.

The lower insulating film 141B formed of a low dielectric constant insulating film to which the fixed charge is to be applied, is not particularly limited, but the following materials can be exemplified: a hafnium oxide, an aluminum oxide, a zirconium oxide, a tantalum oxide, a titanium oxide, a lanthanum oxide, a praseodymium oxide, a cerium oxide, a neodymium oxide, a promethium oxide, a samarium oxide, an europium oxide, a gadolinium oxide, a terbium oxide, a dysprosium oxide, a holmium oxide, a thulium oxide, a ytterbium oxide, a lutetium oxide, a yttrium oxide, an aluminum nitride film, a hafnium oxynitride film, and an aluminum oxynitride.

The separation structure that electrically separates the side surface of the through-electrode 14 and the semiconductor substrate 11 from each other is not particularly limited and can be achieved by, in addition to the vacancy 75, a porous material, TEOS, a silicon oxide film, a silicon nitride film, a low dielectric constant insulating film to which the fixed charge is to be applied, or the like.

The material of the electric conductor 142 of the through-electrode 14 is not particularly limited, and Boron Doped Amorphous Silicon (BDAS), PDAS, a material including at least Cu, Al, Ni, W, Co, Mo, Ti, or Ts and the like can be exemplified.

Embodiment 13

Figure 16A:
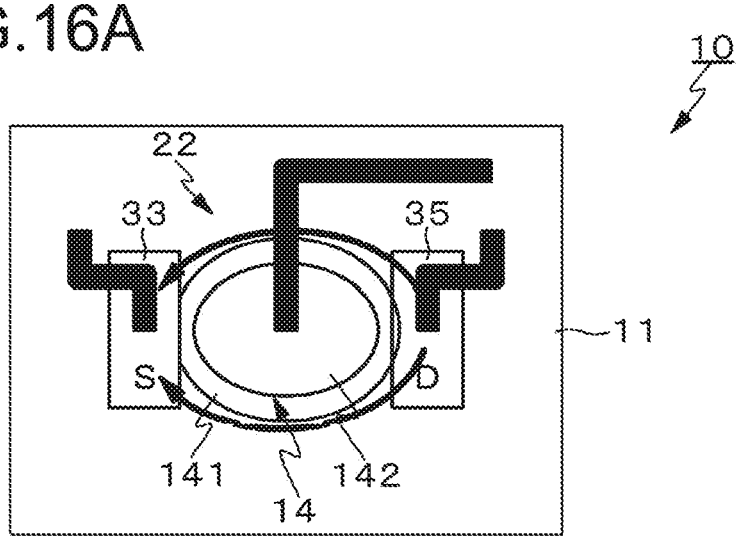
FIG. 16A is a plan view of a solid-state imaging device of Embodiment 13.
Figure 16B:
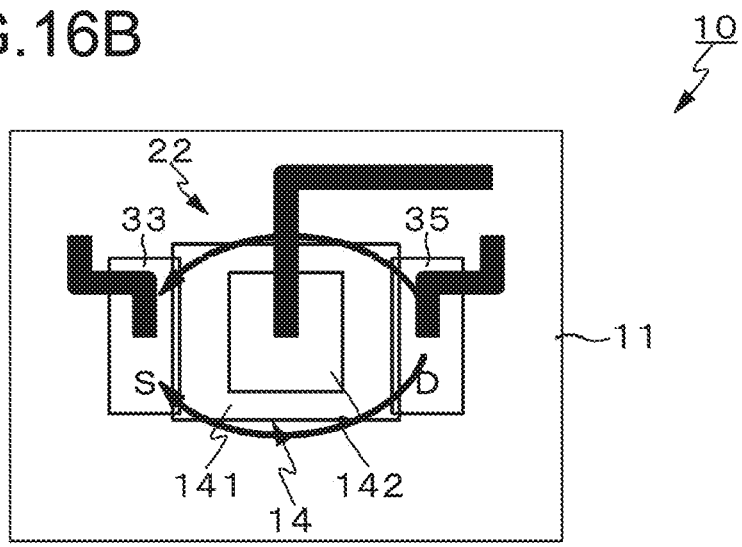
FIG. 16B is a cross-sectional side view of the solid-state imaging device of Embodiment 12.

Embodiment 13 is a modified example of Embodiment 12. FIG. 16A shows a plan view of a solid-state imaging device of a first example of Embodiment 13, and FIG. 16B shows a plan view of a solid-state imaging device of a second example of Embodiment 12.

The shape of the through-electrode 14 may be an ellipse as shown in FIG. 16A, other than a true circle. Alternatively, an arbitrary shape such as a polygon including a square as shown in FIG. 16B can be employed. Further, the shape may be ideal in all the regions in the depth direction of the semiconductor substrate 11 or may differ in each depth position. When a polygonal shape is used as the shape of the through-electrode 14 used as a gate electrode of the amplifier transistor 22, and the channel length is designed in a surface orientation direction having a higher carrier mobility, further improvement in transistor characteristics can be achieved.

Embodiment 14

Figure 17A:
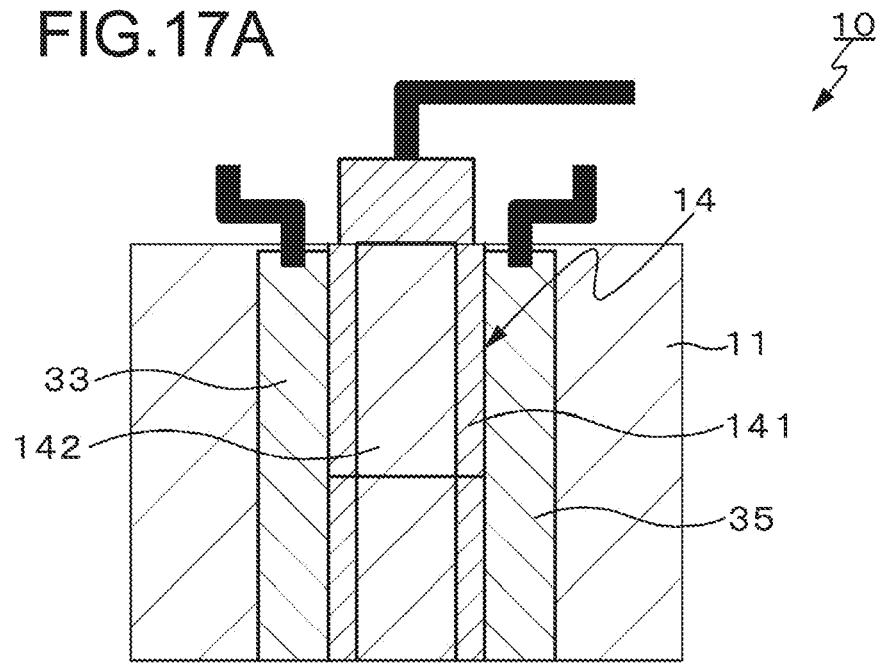
FIG. 17A is a plan view of a solid-state imaging device of Embodiment 14.
Figure 17B:
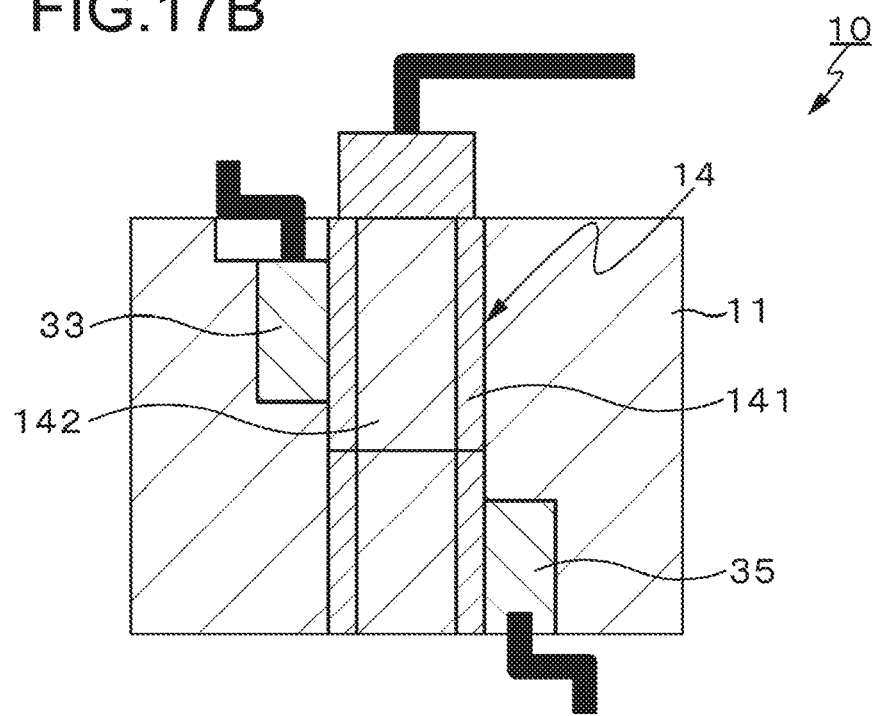
FIG. 17B is a cross-sectional side view of the solid-state imaging device of Embodiment 14.

Embodiment 14 is a modified example of Embodiment 7 to Embodiment 12. FIG. 17A shows a cross-sectional side view of a solid-state imaging device of a first example of Embodiment 14, and FIG. 17B shows a cross-sectional side view of a solid-state imaging device of a second example of Embodiment 14.

For arrangement of the source region 33 and the drain region 35 of the amplifier transistor 22, in Embodiment 7 to Embodiment 9, the source region 33 and the drain region 35 are both disposed near the surface of the semiconductor substrate 11. In contrast to this, Embodiment 11 has a configuration in which, from a viewpoint of control or the channel width or channel length of the amplifier transistor 22, the source region 33, the drain region 35, and the channel region are formed over the entire region of the semiconductor substrate 11 in the depth direction (corresponding to Embodiment 3) as shown in FIG. 17A. Alternatively, as shown in FIG. 17B, Embodiment 11 has a configuration in which the source region 33, the drain region 35, and the channel region are formed at different depth positions in the depth direction of the semiconductor substrate 11.

Embodiment 15

Figure 18A:
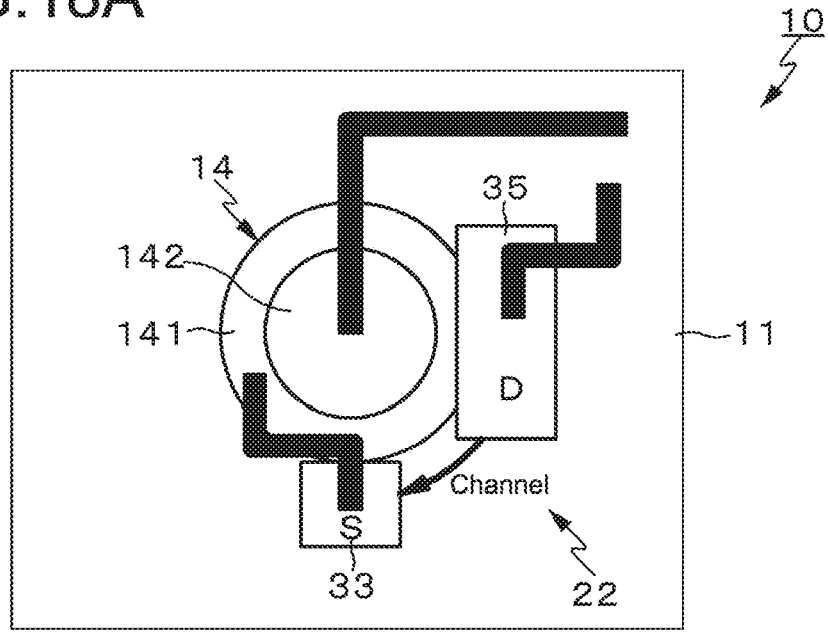
FIG. 18A is a plan view of a solid-state imaging device of Embodiment 15.
Figure 18B:
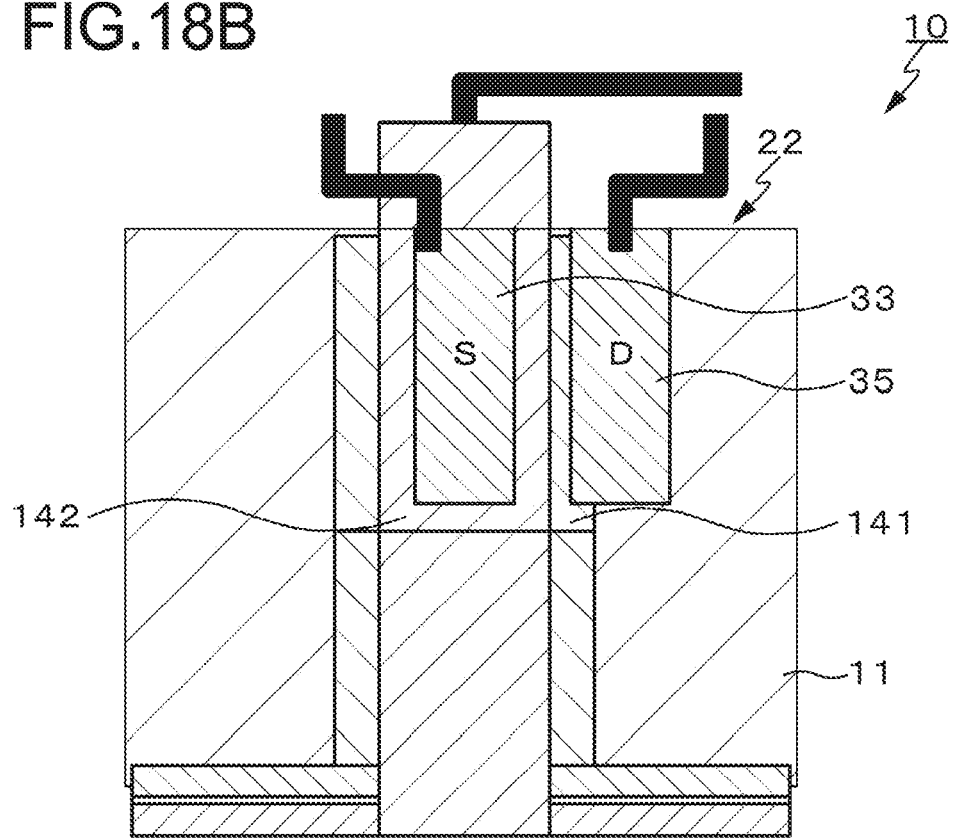
FIG. 18B is a cross-sectional side view of the solid-state imaging device of Embodiment 15.

Embodiment 15 is a modified example of Embodiment 7 to Embodiment 12. FIG. 18A shows a plan view of a solid-state imaging device of Embodiment 15, and FIG. 18B shows a cross-sectional side view of the solid-state imaging device of Embodiment 15.

For arrangement of the source region 33 and the drain region 35 of the amplifier transistor 22, in Embodiment 7 to Embodiment 9, the source region 33 and the drain region 35 are disposed diagonally in the circumferential direction of the through-electrode 14, that is, disposed to face each other with the through-electrode 14 being sandwiched therebetween. In contrast to this, as shown in FIG. 18A and FIG. 18B, Embodiment 12 has a configuration in which the source region 33 and the drain region 35 are disposed not diagonally in the circumferential direction of the through-electrode 14. A positional relationship between the source region 33 and the drain region 35 in the circumferential direction of the through-electrode 14 can be arbitrarily set from a viewpoint of the channel length of the amplifier transistor 22.

Embodiment 16

Figure 19A:
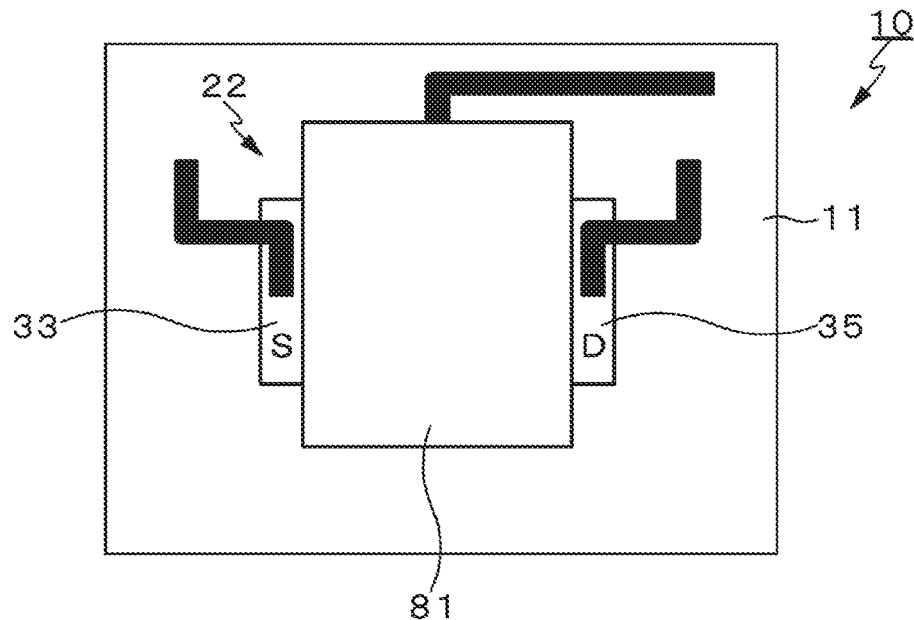
FIG. 19A is a plan view of a solid-state imaging device of Embodiment 16.
Figure 19B:
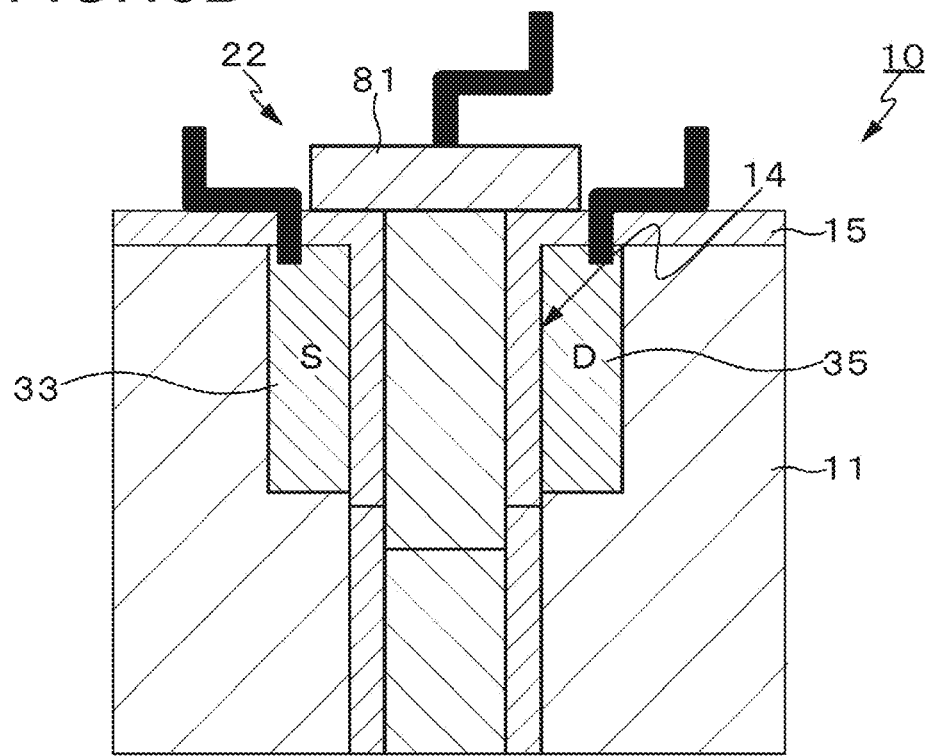
FIG. 19B is a cross-sectional side view of the solid-state imaging device of Embodiment 16.

Embodiment 16 is a modified example of Embodiment 1 to Embodiment 12. FIG. 19A shows a plan view of a solid-state imaging device of Embodiment 16, and FIG. 19B shows a cross-sectional side view of the solid-state imaging device of Embodiment 16.

The amplifier transistor 22 of each of Embodiment 1 to Embodiment 12 has a transistor structure in which the through-electrode 14 is used as a gate electrode thereof, and a side surface channel between the source region 33 and the drain region 35 in the circumferential direction is used as a channel thereof. In contrast to this, Embodiment 13 has a configuration in which a cap electrode 81 formed of an electric conductor and provided at the top of the through-electrode 14 is provided to be extended to the vicinity of the source region 33, the drain region 35, or the channel region.

Since the cap electrode 81 is extended, the amplifier transistor 22 becomes a front surface channel transistor including the cap electrode 81, the source region 33, and the drain region 35. In addition, it is possible to form the channel length in the depth direction of the semiconductor substrate 11 by using the side surface channel between the source region 33 and the drain region 35 in the circumferential direction.

Embodiment 17

Figure 20A:
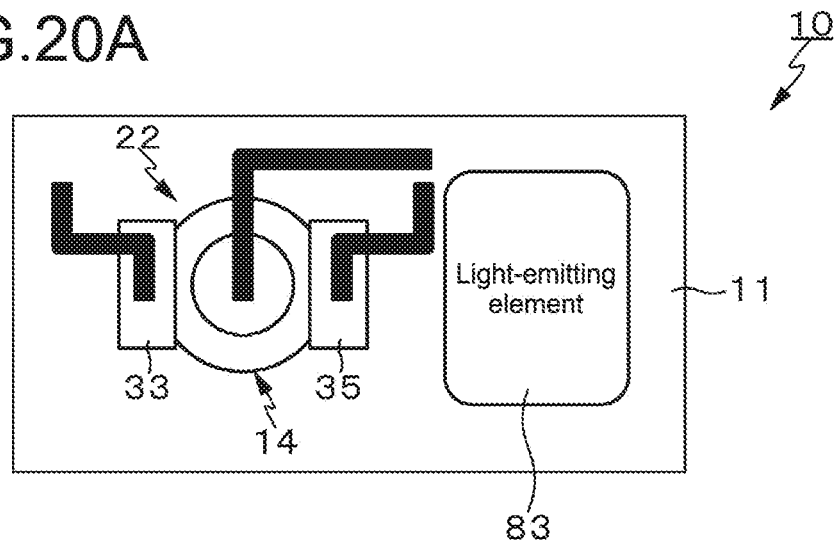
FIG. 20A is a plan view of a solid-state imaging device of Embodiment 17.
Figure 20B:
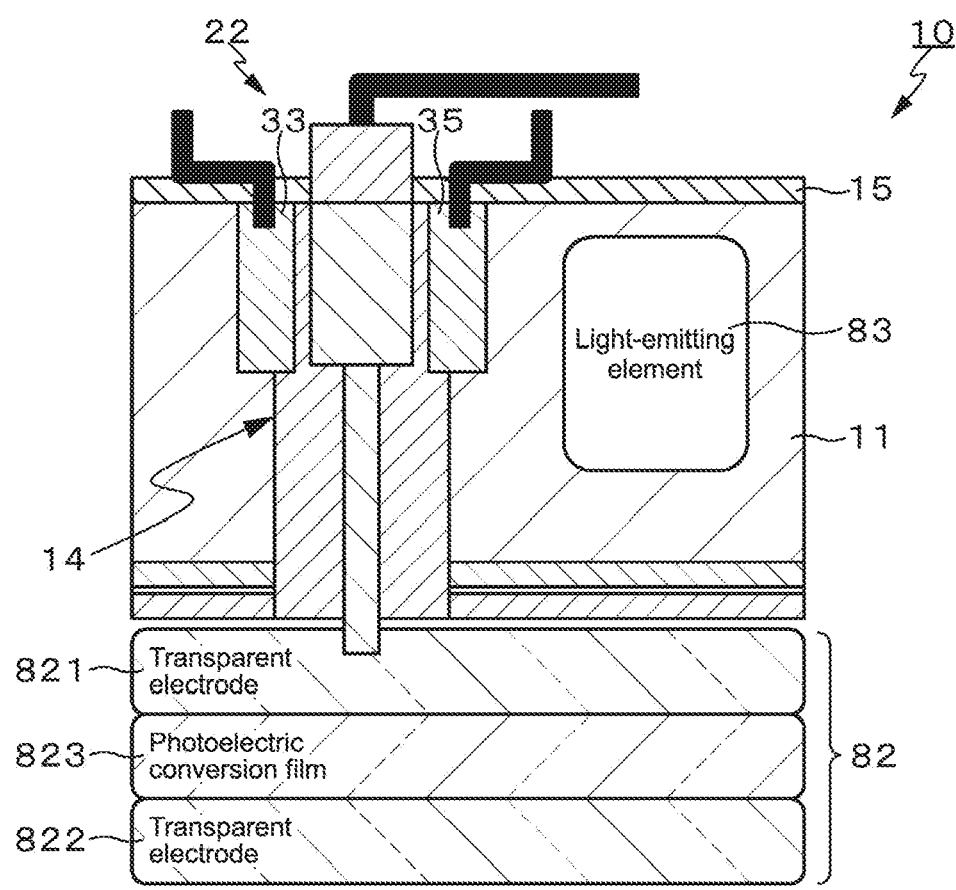
FIG. 20B is a cross-sectional side view of the solid-state imaging device of Embodiment 17.

Embodiment 17 relates to a solid-state imaging device that functions as a wavelength converter element. FIG. 20A shows a plan view of a solid-state imaging device of Embodiment 17, and FIG. 20B shows a cross-sectional side view of the solid-state imaging device of Embodiment 17.

Embodiment 8 has the configuration in which the through-electrode 14 is connected to the floating diffusion FD on the second semiconductor substrate 72 side, the second semiconductor substrate 72 being different from the first semiconductor substrate 71 on which that through-electrode 14 is formed. However, a destination to which the through-electrode 14 is to be connected is not necessarily the different second semiconductor substrate 72 and may be a wire, an electric conductor, or a different type of semiconductor that is disposed on the opposite side to the amplifier transistor 22 of the first semiconductor substrate 71.

Embodiment 17 has a configuration in which the destination to which the through-electrode 14 is to be connected is a photoelectric converter element 82 disposed on the opposite side to the amplifier transistor 22 of the semiconductor substrate 11 corresponding to the first semiconductor substrate 71. The photoelectric converter element 82 includes, for example, two transparent electrodes 821, 822 and a photoelectric conversion film 823 sandwiched between those transparent electrodes 821, 822. In the photoelectric converter element 82, photoelectric conversion that corresponds to an absorption wavelength of the photoelectric conversion film 823 is performed. It should be noted that a light-emitting element 83 is formed in the semiconductor substrate 11. An input terminal of the light-emitting element 83 is connected to an output terminal of the amplifier transistor 22, and the light-emitting element 83 is driven to emit light by the amplifier transistor 22.

In the solid-state imaging device of Embodiment 17, along with storage of carriers generated by photoelectric conversion of the photoelectric converter element 82, the potential of the through-electrode 14 varies. Because of the variation of the potential of the through-electrode 14, a voltage at the output terminal of the amplifier transistor 22 on the front surface side of the semiconductor substrate 11 varies. Accordingly, the light-emitting element 83 is driven to emit light by the voltage at the output terminal of the amplifier transistor 22. As a result, in the light-emitting element 83, light having a different wavelength with a light amount corresponding to the amount of light absorbed by the photoelectric conversion film 823 is emitted.

As described above, the solid-state imaging device of Embodiment 17 has a function as a wavelength converter element that receives incident light in the photoelectric converter element 82, converts the incident light into light having a different wavelength with a light amount corresponding to the amount of light absorbed by the photoelectric conversion film 823, and emits the resultant light.

Embodiment 18

Figure 21A:
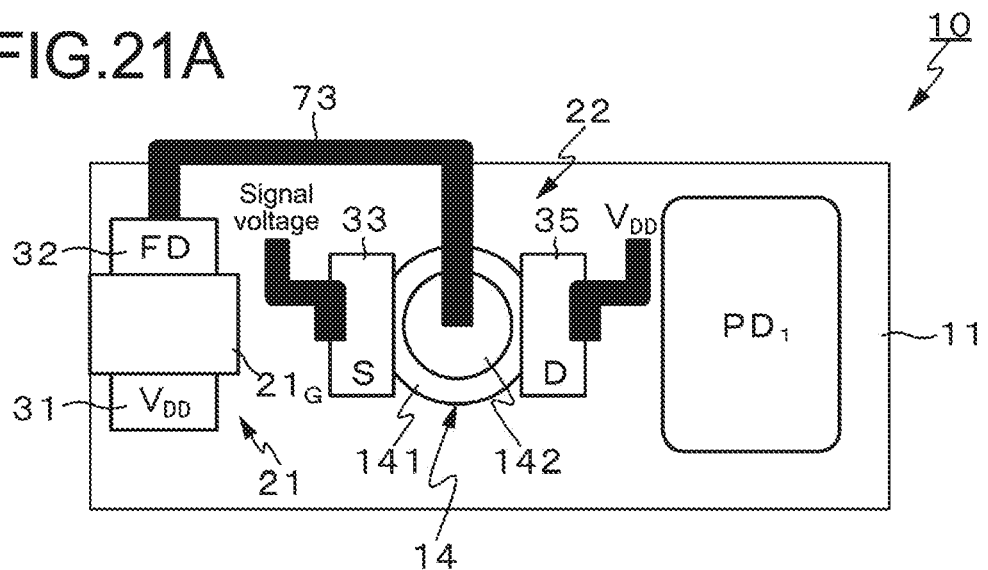
FIG. 21A is a plan view of a solid-state imaging device of Embodiment 18.
Figure 21B:
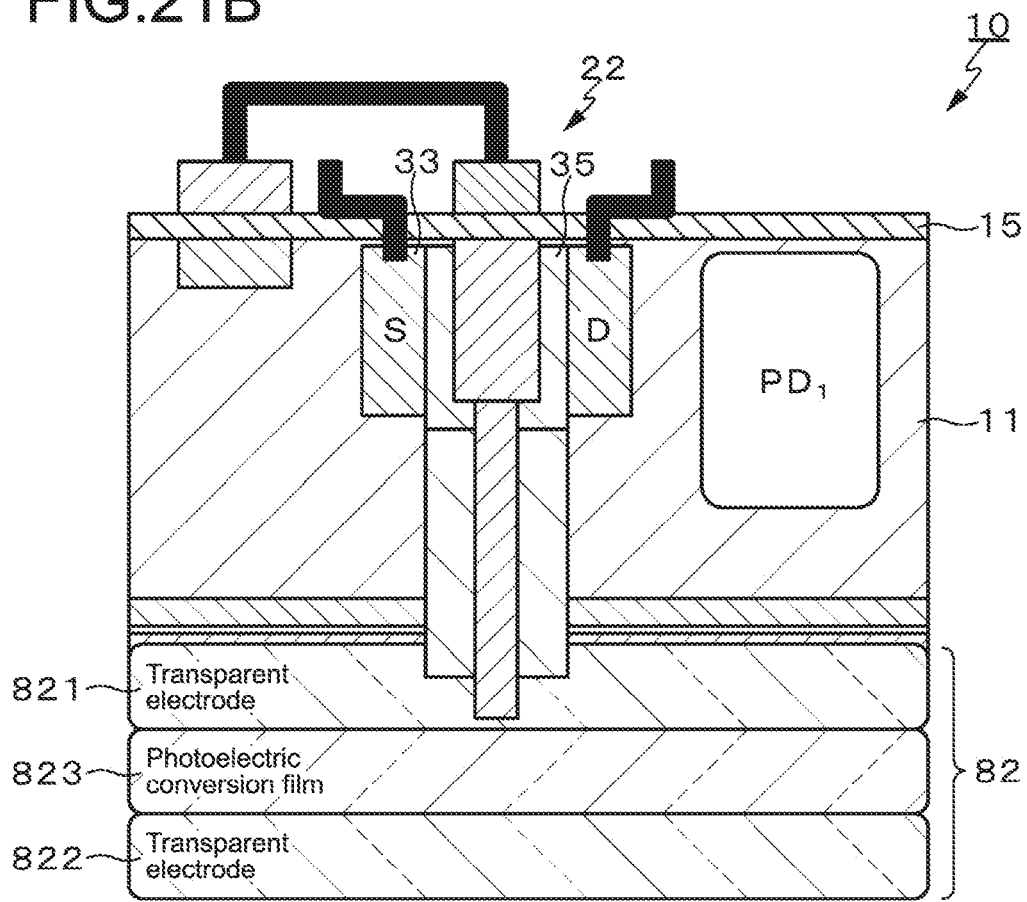
FIG. 21B is a cross-sectional side view of the solid-state imaging device of Embodiment 18.

Embodiment 18 is a modified example of Embodiment 17. FIG. 21A shows a plan view of a solid-state imaging device of Embodiment 18, and FIG. 21B shows a cross-sectional side view of the solid-state imaging device of Embodiment 18.

Embodiment 18 has a configuration in which a photodiode $PD_1$ is formed, instead of the light-emitting element 83 of Embodiment 14, at the region thereof in the semiconductor substrate 11, and the reset transistor 21 is additionally formed across the through-electrode 14. In other words, the configuration of the semiconductor substrate 11 of Embodiment 18 is the same as the configuration the first semiconductor substrate 71 of Embodiment 8. Therefore, Embodiment 18 is a modified example of Embodiment 8 as well.

In such a manner, the solid-state imaging device of Embodiment 18 has a structure in which a destination to which the through-electrode 14 is to be connected is the photoelectric converter element 82 in the semiconductor substrate 11 in which the photodiode $PD_1$ is formed. According to the solid-state imaging device of Embodiment 18 having such a structure, a solid-state imaging device that disperses light in the vertical direction can be achieved.

Embodiment 19

Embodiment 19 relates to a method of manufacturing the solid-state imaging device of Embodiment 7. FIGS. 22 to 25 show process charts of a method of manufacturing a solid-state imaging device according to Embodiment 19. Further, the solid-state imaging devices of Embodiment 8 to Embodiment 18 can also be manufactured by combining the manufacturing method to be described below with a known method of manufacturing a semiconductor device.

Figure 22A:
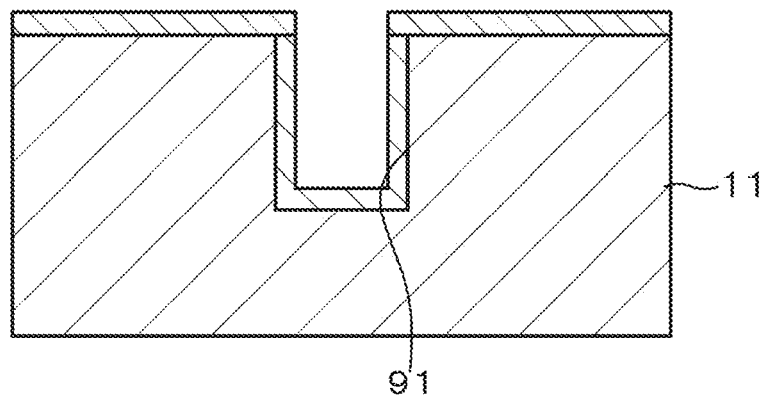
FIG. 22A, FIG. 22B, FIG. 22C are process charts (part 1) of a method of manufacturing a solid-state imaging device according to Embodiment 19.
Figure 22B:
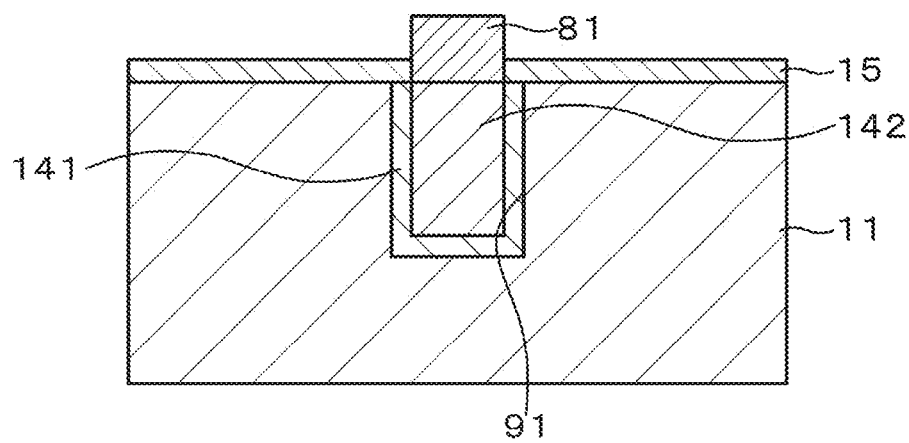

First, in the process of FIG. 22A, a trench 91 that is to be a transistor unit of the through-electrode 14 is formed by etching the semiconductor substrate 11. Next, in the process of FIG. 22B, an insulating film 141 as a separation layer is formed in the trench 91, an electrically conductive material is embedded therein, and an electric conductor 142 is thus formed. Further, a cap electrode 81 is formed at the top of the electric conductor 142.

Figure 22C:
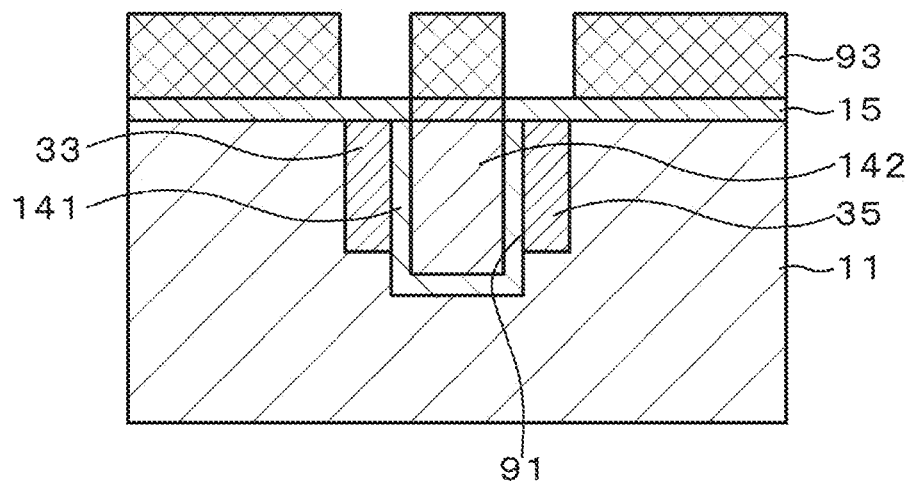

Next, in the process of FIG. 22C, a channel unit is covered with a mask 93, implantation is performed thereon, and a source region 33 and a drain region 35 of the amplifier transistor 22 are formed. It should be noted that the source region 33 and the drain region 35 may be formed by implantation before performing wiring, or may be formed by performing implantation in an oblique direction on the side surface of the trench 91 such that only the side surfaces of the source region 33 and the drain region 35 are subjected to the implantation after the trench 91 is formed. Further, the source region 33 and the drain region 35 may be formed by performing annealing on a highly doped material and performing doping by solid-phase diffusion, the highly doped material being selectively deposited on only two side surfaces of the trench 91 or being left by selective etching. The channel can also be formed by a method similar to that of the formation of the source region 33 and the drain region 35, in which only a target concentration is different.

Figure 23A:
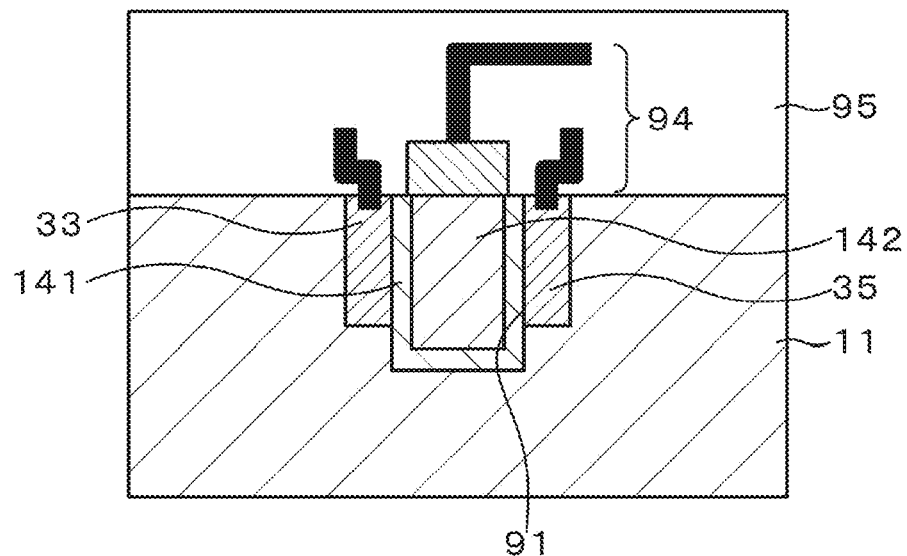
FIG. 23A and FIG. 23B are process charts (part 2) of the method of manufacturing a solid-state imaging device according to Embodiment 19.
Figure 23B:
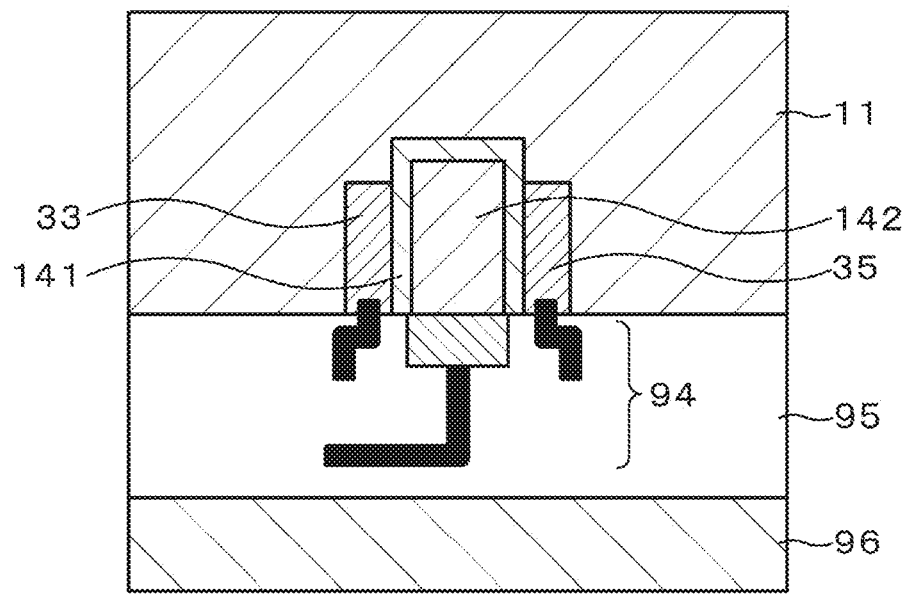
Figure 24A:
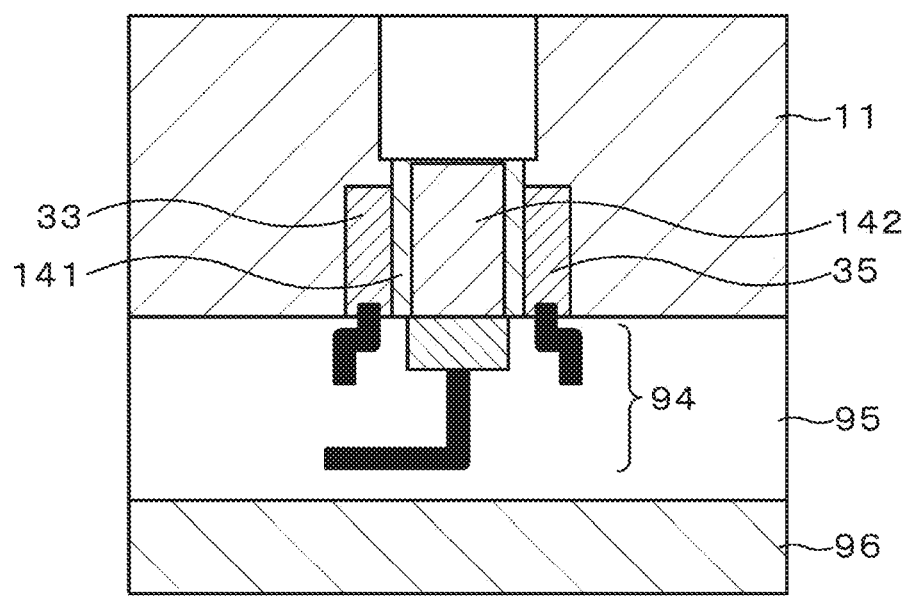
FIG. 24A and FIG. 24B are process charts (part 3) of the method of manufacturing a solid-state imaging device according to Embodiment 19.
Figure 24B:
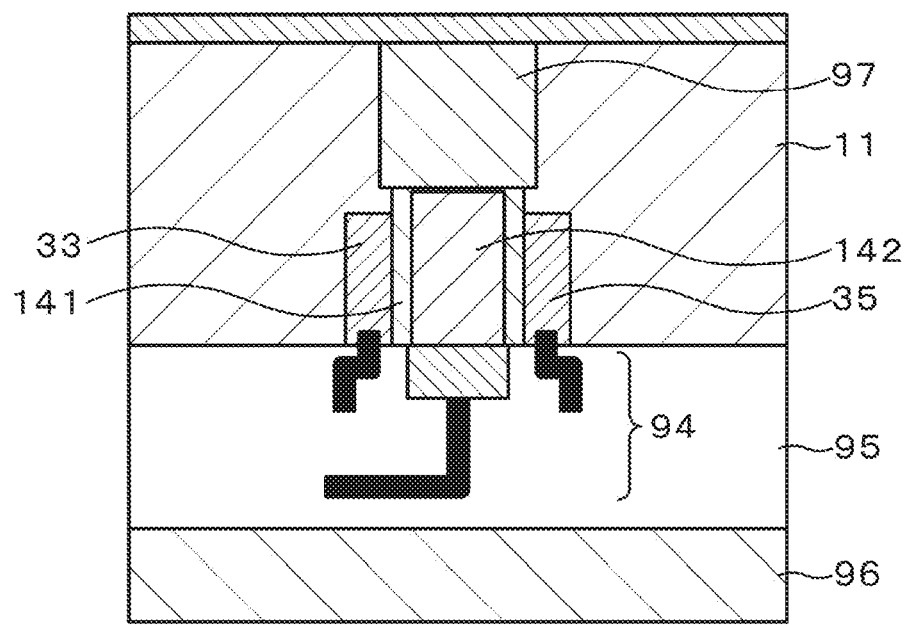

Next, in the process of FIG. 23A, a contact and a wire 94 are formed on the electric conductor 142, and an interlayer insulating film 95 or the like is applied. Next, in the process of FIG. 23B, an adhesive material surface is bonded to a support substrate 96, the semiconductor substrate 11 is evenly etched from the opposite direction to the transistor forming surface, and the film thickness of the substrate is made thinner as much as necessary. Next, in the process of FIG. 24A, a target portion of the semiconductor substrate 11 is selectively etched so as to expose the electric conductor 142. Subsequently, in the process of FIG. 24B, a separation layer 97 is embedded in the portion selectively etched.

Figure 25A:
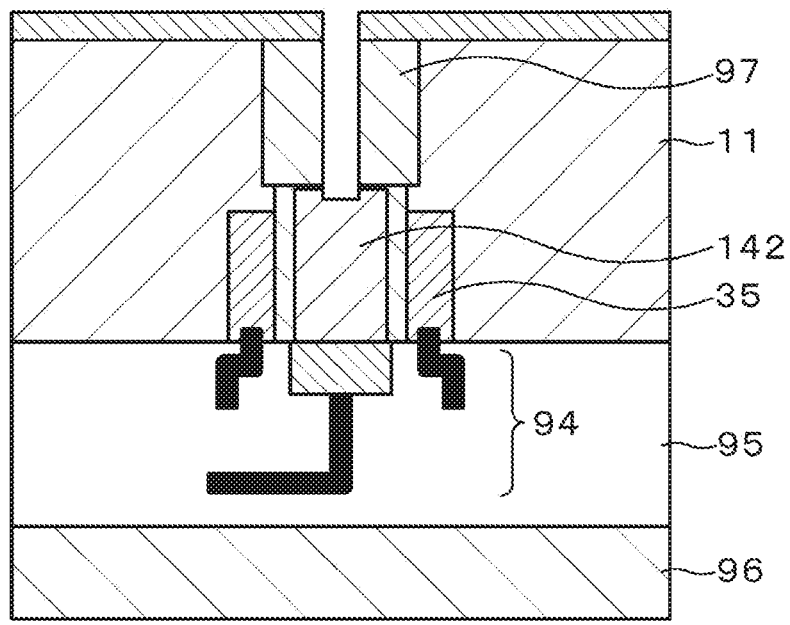
FIG. 25A and FIG. 25B are process charts (part 4) of the method of manufacturing a solid-state imaging device according to Embodiment 19.
Figure 25B:
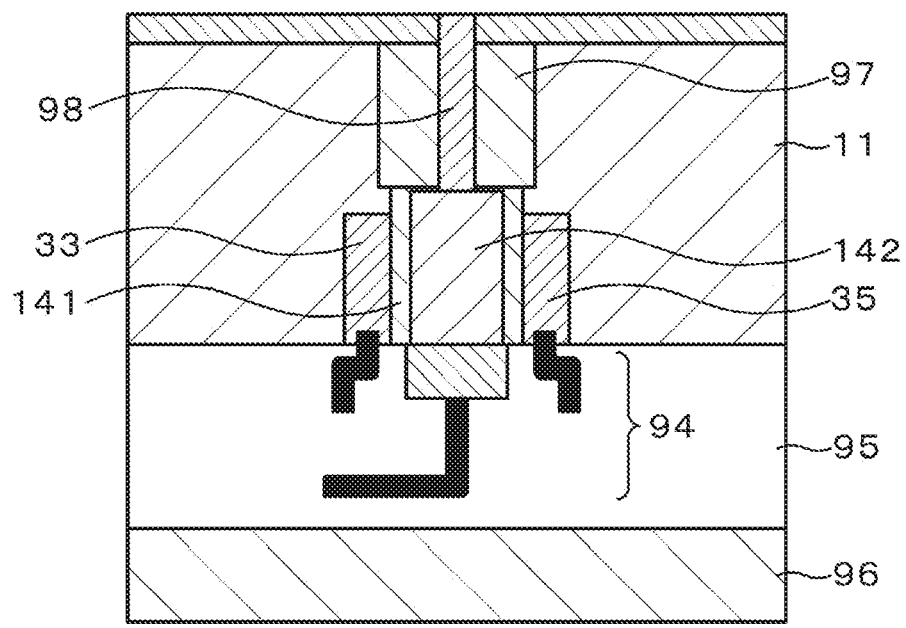

Next, in the process of FIG. 25A, selective etching is performed so as to expose the electric conductor 142 again from the separation layer 97 embedded in the former process. Subsequently, in the process of FIG. 25B, an electric conductor 98 is embedded so as to perform electrical connection. Although illustration of subsequent processes is omitted, an insulating film, an adhesive material, an electrode material, and the like are deposited depending on a device to be produced and are electrically connected to a desired element.

Here, processes other than the main processing and manufacturing processes of the through-electrode 14 are omitted. However, doping for a well or doping for enhancing accumulation, or impurity activation, an annealing process for defect recovery, an oxide film forming process, or the like can be performed as needed before or after the trench is formed.

According to this manufacturing method, a transistor forming unit and a portion to transmit a voltage from the back surface side are separately formed. This makes it easy to separately form a favorable configuration for the transistor forming unit and a favorable configuration for others excluding the transistor unit as shown in Embodiment 7, and high device characteristics can be obtained.

Hereinabove, the technology of the present disclosure has been described using the solid-state imaging device as an example of the semiconductor device. When the technology of the present disclosure is applied to the solid-state imaging device, the through-electrode 14 also serves as a gate electrode of the amplifier transistor 22, and an action and effect of enabling the proportion of the through-electrode 14 in the flat surface of a pixel to be reduced can be obtained. Further, in a semiconductor device other than the solid-state imaging device, when the through-electrode 14 also serves as a gate electrode of the amplifier transistor 22, an action and effect capable of minimizing an area occupied the through-electrode 14 for another element such as the amplifier transistor 22 within the semiconductor substrate 11 can be obtained.

<Electronic Apparatus of Present Disclosure>

The solid-state aging devices of Embodiment 1 to Embodiment 5 and Embodiment 7 to Embodiment 19 described above can be used as an imaging unit (image capturing unit) of all electronic apparatuses including imaging apparatuses such as a digital still camera and a video camera, portable terminal apparatuses having an imaging function such as a mobile phone, and copying machines using a solid-state imaging device for an image reading unit. It should be noted that the above-mentioned module-like form provided to the electronic apparatus, a camera module is considered as an imaging apparatus in some cases.

[Imaging apparatus]

Figure 26:
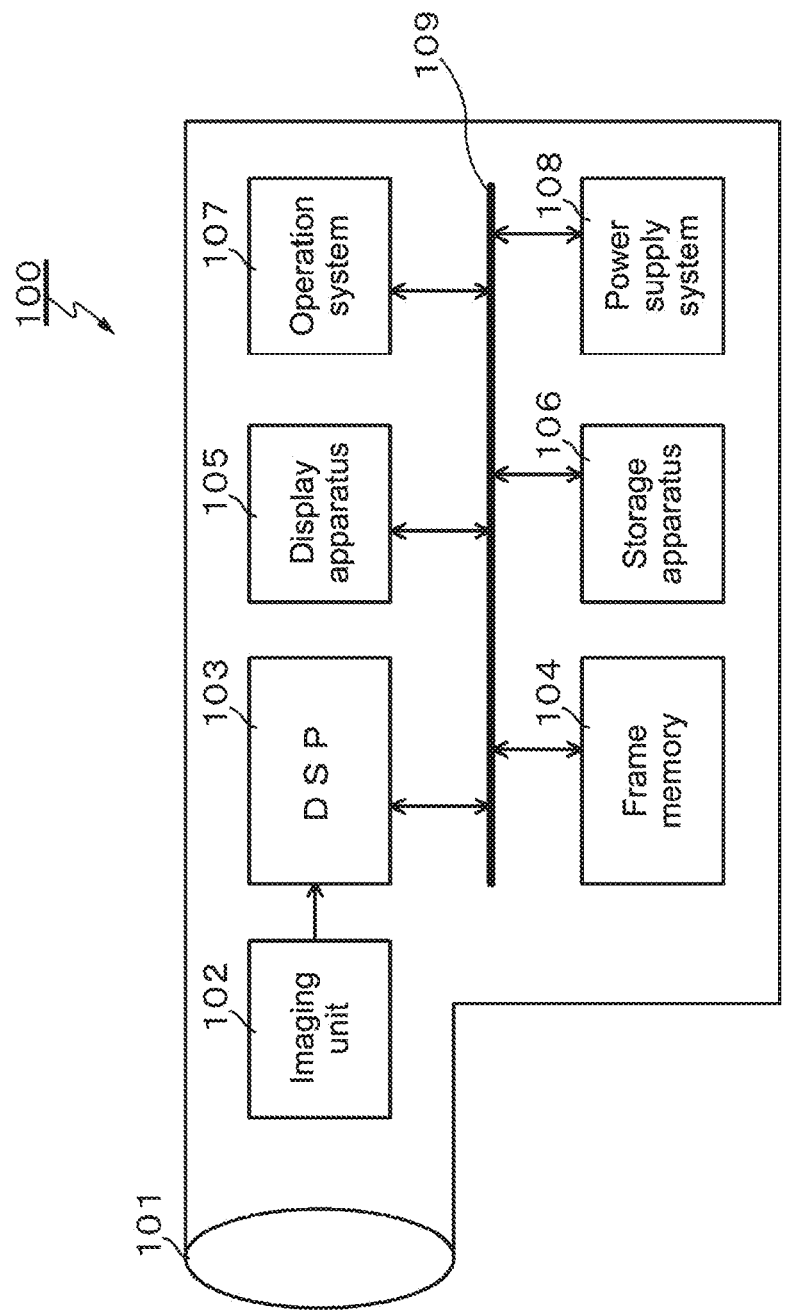
FIG. 26 is a block diagram showing a configuration of an imaging apparatus as an example of an electronic apparatus according to the present disclosure.

FIG. 26 is a block diagram showing a configuration of an imaging apparatus as an example of an electronic apparatus according to the present disclosure. As shown in FIG. 26, an imaging apparatus 100 according to this embodiment includes an optical system 101 including a lens group and the like, an imaging unit 102, a digital signal processor DSP) circuit 103 that is a camera signal processing unit, a frame memory 104, a display apparatus 105, a recording apparatus 106, an operation system 107, and a power supply system 108. The DSP circuit 103, the frame memory 104, the display apparatus 105, the recording apparatus 106, the operation system 107, and the power supply system 108 are connected to one another via a bus line 109.

The optical system 101 takes in incident light coming from a subject (image light) and forms an image on an imaging surface of the imaging unit 102. The imaging unit 102 converts the amount of incident light, with which the image is formed on the imaging surface by the optical system 101, into an electrical signal on a pixel-by-pixel basis and outputs the electrical signal as a pixel signal. The DSP circuit 103 performs general camera signal processing, for example, white balance processing, demosaic processing, and gamma correction processing.

The frame memory 104 is used to store data appropriately in the process of the signal processing of the DSP circuit 103. The display apparatus 105 includes a panel display apparatus such as a liquid crystal display apparatus or an organic EL (Electra Luminescence) display apparatus and displays moving images or still images captured by the imaging unit 102. The recording apparatus 106 records the moving images or still images captured by the imaging unit 102 on a recording medium such as a portable semiconductor memory, an optical disc, or an HDD (Hard Disk Drive).

The operation system 107 issues an operation command on various functions of the imaging apparatus 100 under the operation of a user. The power supply system 108 appropriately supplies various types of power, by which the DSP circuit 103, the frame memory 104, the display apparatus 105, the recording apparatus 106, and the operation system 107 operate, to those supply targets.

In the imaging apparatus 100 having the configuration described above, the solid-state imaging device of each of Embodiment 1 to Embodiment 5 or Embodiment 7 to Embodiment 19 described above can be used as the imaging unit 102.

It should be noted that the present disclosure can take the following configurations.

[1] A semiconductor device, including:
  a semiconductor element disposed on a first surface side of a semiconductor substrate;
  a through-electrode that is provided through the semiconductor substrate in a thickness direction of the semiconductor substrate and introduces charge obtained in the semiconductor element to a second surface side of the semiconductor substrate; and
  an amplifier transistor that outputs an electrical signal based on the charge introduced by the through-electrode, the amplifier transistor using the through-electrode as a gate electrode and including a source region and a drain region around the through-electrode.

[2] The semiconductor device according to [1], in which
  the through-electrode includes
    an electric conductor that is provided through the semiconductor substrate, and
    a separation layer that electrically separates the electric conductor and the semiconductor substrate from each other.

[3] The semiconductor device according to [2], in which
  the separation layer is formed of an insulating film that covers a side wall of the electric conductor.

[4] The semiconductor device according to [2] or [3], in which
  a film thickness of the insulating film differs depending on a position of the semiconductor substrate in a depth direction.

[5] The semiconductor device according to any one of [1] to [4], in which
  the source region and the drain region of the amplifier transistor are each formed of a diffusion layer, the diffusion layer being present in the vicinity of an insulating film and formed at a part of or over the entire region of the semiconductor substrate in a depth direction.

[6] The semiconductor device according to [1], further including
  a planar transistor that is formed on a flat surface of the semiconductor substrate, in which
  a gate oxide film of the planar transistor and a gate oxide film of the amplifier transistor are different from each other in a film thickness.

[7] The semiconductor device according to [1], further including
  a planar transistor that is formed on a flat surface of the semiconductor substrate, in which
  a gate oxide film of the planar transistor and a gate oxide film of the amplifier transistor are different from each other in a constituent material.

[8] The semiconductor device according to [1], further including
  a cap electrode that is formed of an electric conductor and provided at a top of the through-electrode, the cap electrode being provided to be extended to the vicinity of the source region, the drain region, or a channel region of the amplifier transistor.

[9] The semiconductor device according to [1], in which
  the electric conductor includes at least one layer in a length direction and is formed of at least one type of electric conductor material.

[10] The semiconductor device according to [9], in which the electric conductor includes a first electric conductor and a second electric conductor, the first electric conductor functioning as the gate electrode of the amplifier transistor, the second electric conductor being continuous with the first electric conductor.

[11] The semiconductor device according to [10], in which the first electric conductor has a work function that desirably sets an operation range of the amplifier transistor.

[12] The semiconductor device according to [11], in which an insulating film that separates the first electric conductor and the semiconductor substrate from each other is thinner than an insulating film that separates the second electric conductor and the semiconductor substrate from each other, and is formed of a material having a higher dielectric constant than a material of the insulating film that separates the second electric conductor and the semiconductor substrate from each other.

[13] The semiconductor device according to any one of [10] to [12], in which
the second electric conductor has a smaller diameter than a diameter of the first electric conductor and is formed of an electrically conductive material.

[14] The semiconductor device according to any one of [10] to [12], in which
an insulating film around the first electric conductor and an insulating film around the second electric conductor are different from each other in a film thickness.

[15] The semiconductor device according to [14], in which the insulating film around the second electric conductor is formed of a low dielectric constant insulating film.

[16] The semiconductor device according to [15], in which the insulating film around the second electric conductor forms a separation structure together with a vacancy that intervenes between the second electric conductor and the insulating film, the separation structure electrically separating the second electric conductor and the semiconductor substrate from each other.

[17] The semiconductor device according to [16], in which a fixed charge amount that is applied to the insulating film around the first electric conductor and a fixed charge amount that is applied to the insulating film around the second electric conductor are different from each other.

[18] A method of manufacturing a semiconductor device, the semiconductor device including
a semiconductor element disposed on a first surface side of a semiconductor substrate,
a through-electrode that is provided through the semiconductor substrate in a thickness direction of the semiconductor substrate and introduces charge obtained in the semiconductor element to a second surface side of the semiconductor substrate, and
an amplifier transistor that outputs an electrical signal based on the charge introduced by the through-electrode, the method including:
using the through-electrode as a gate electrode of the amplifying transistor; and
forming a source region and a drain region of the amplifier transistor around the through-electrode.

[19] A solid-state imaging device, including:
a photoelectric converter element disposed on a first surface side of a semiconductor substrate;
a through-electrode that is provided through the semiconductor substrate in a thickness direction of the semiconductor substrate and introduces charge obtained by photoelectric conversion of the photoelectric converter element to a second surface side of the semiconductor substrate; and
an amplifier transistor that outputs an electrical signal based on the charge introduced by the through-electrode, the amplifier transistor using the through-electrode as a gate electrode and including a source region and a drain region around the through-electrode.

[20] An electronic apparatus, including
a solid-state imaging device including
a photoelectric converter element disposed on a first surface side of a semiconductor substrate,
a through-electrode that is provided through the semiconductor substrate in a thickness direction of the semiconductor substrate and introduces charge obtained by photoelectric conversion of the photoelectric converter element to a second surface side of the semiconductor substrate, and
an amplifier transistor that outputs an electrical signal based on the charge introduced by the through-electrode, the amplifier transistor using the through-electrode as a gate electrode and including a source region and a drain region around the through-electrode.

REFERENCE SIGNS LIST 10 pixel (unit pixel)
11, 17 semiconductor substrate
12 interlayer insulating film
13, 82 photoelectric converter element
14 through-electrode
15 gate oxide film (insulating film)
16 wiring layer
21 reset transistor
22 amplifier transistor
23 selection transistor
31-35 diffusion layer
41 reset control line
42 selection control line
43 vertical signal line
71 first semiconductor substrate
72 second semiconductor substrate
74 read transistor
81 cap electrode
83 light-emitting element
131, 132, 821, 822 transparent electrode
133, 823 photoelectric conversion film
141 insulating film (gate oxide film)
142 electric conductor

What is claimed is:
1. A semiconductor device, comprising:
a semiconductor element disposed on a back surface side of a semiconductor substrate, wherein the semiconductor element comprises a photoelectric conversion film sandwiched between two transparent electrodes, and wherein an insulating film is between the semiconductor element and the semiconductor substrate;
a through-electrode that is provided through the semiconductor substrate in a depth direction of the semiconductor substrate and introduces charge obtained in the semiconductor element to a front surface side of the semiconductor substrate, wherein the through-electrode is composed of a conductor that penetrates the semiconductor substrate and a separation layer that electrically separates the conductor and the semiconductor substrate; and an amplifier transistor disposed on the front surface side of the semiconductor substrate that outputs an electrical signal based on the charge introduced by the through-electrode, the amplifier transistor using the through-electrode as a gate electrode and including a source region and a drain region around the through-electrode, wherein the gate electrode of the amplifier transistor is electrically connected to the semiconductor element via a wire.

2. The semiconductor device according to claim 1, wherein the through-electrode includes:
the conductor embedded in a center portion of the through-electrode, and
a side wall portion covered with a second insulating film.

3. The semiconductor device according to claim 2, wherein a film thickness of the second insulating film that covers the side wall portion differs depending on a position of the semiconductor substrate in the depth direction.

4. The semiconductor device according to claim 1, wherein the source region and the drain region of the amplifier transistor are each formed of a diffusion layer, wherein each diffusion layer is in a vicinity of a third insulating film, and wherein each diffusion layer is formed at a part of or over an entire region of the semiconductor substrate in the depth direction.

5. The semiconductor device according to claim 1, further comprising:
a planar transistor that is formed on the front surface side of the semiconductor substrate, wherein a gate oxide film of the planar transistor and a gate oxide film of the amplifier transistor are different from each other in a film thickness.

6. The semiconductor device according to claim 1, further comprising:
a planar transistor that is formed on the front surface side of the semiconductor substrate, wherein a gate oxide film of the planar transistor and a gate oxide film of the amplifier transistor are different from each other in a constituent material.

7. The semiconductor device according to claim 1, further comprising:
a cap electrode that is formed of an electric conductor and provided at a top of the through-electrode, the cap electrode being provided to be extended to a vicinity of the source region, the drain region, or a channel region of the amplifier transistor.

8. The semiconductor device according to claim 2, wherein the conductor includes at least one layer in a length direction and is formed of at least one type of electric conductor material.

9. The semiconductor device according to claim 8, wherein the conductor includes a first electric conductor and a second electric conductor, the first electric conductor functioning as the gate electrode of the amplifier transistor, the second electric conductor being continuous with the first electric conductor.

10. The semiconductor device according to claim 9, wherein the first electric conductor has a work function that sets an operation range of the amplifier transistor.

11. The semiconductor device according to claim 10, wherein the second insulating film that covers the side wall portion of the first electric conductor is thinner than and is formed of a material having a higher dielectric constant than a material of a fourth insulating film that covers a side wall portion of the second electric conductor.

12. The semiconductor device according to claim 9, wherein the second electric conductor has a smaller diameter than a diameter of the first electric conductor and is formed of an electrically conductive material.

13. The semiconductor device according to claim 9, wherein the second insulating film that covers the side wall portion of the first electric conductor and a fourth insulating film that covers a side wall portion of the second electric conductor are different from each other in a film thickness.

14. The semiconductor device according to claim 13, wherein the fourth insulating film that covers the side wall portion of the second electric conductor is formed of a low dielectric constant insulating film.

15. The semiconductor device according to claim 14, wherein the fourth insulating film that covers the side wall portion of the second electric conductor forms a separation structure together with a vacancy that intervenes between the second electric conductor and the fourth insulating film.

16. The semiconductor device according to claim 15, wherein a fixed charge amount that is applied to the second insulating film that covers the side wall portion of the first electric conductor and a fixed charge amount that is applied to the fourth insulating film that covers the side wall portion of the second electric conductor are different from each other.

* * * * *